US012740058B2

(12) United States Patent
Kim et al.

(10) Patent No.: US 12,740,058 B2
(45) Date of Patent: Sep. 15, 2026

(54) NONVOLATILE MEMORY DEVICE WITH MILC CHANNEL

(71) Applicant: Samsung Electronics Co., Ltd., Suwon-si (KR)

(72) Inventors: Yu Yeon Kim, Suwon-si (KR); Si Yeong Yang, Suwon-si (KR); Chae Ho Kim, Suwon-si (KR); Kwang Min Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 524 days.

(21) Appl. No.: 18/140,009

(22) Filed: Apr. 27, 2023

(65) Prior Publication Data

US 2024/0081061 A1 Mar. 7, 2024

(30) Foreign Application Priority Data

Aug. 17, 2022 (KR) ........................ 10-2022-0102508

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02);
(Continued)

(58) Field of Classification Search
CPC ........ H10B 53/00; H10B 53/10; H10B 53/20; H10B 53/30; H10B 53/40; H10B 53/50;
(Continued)

(56) References Cited

U.S. PATENT DOCUMENTS 7,112,475 B2 9/2006 So
9,318,329 B2 4/2016 Kohji et al.
(Continued)

FOREIGN PATENT DOCUMENTS

KR 10-2008-0105563 A 12/2008
KR 10-2020-0083395 A 7/2020
(Continued)

*Primary Examiner* — William B Partridge
*Assistant Examiner* — Gustavo G Ramallo
(74) *Attorney, Agent, or Firm* — Muir Patent Law, PLLC

(57) ABSTRACT

A volatile memory device and a nonvolatile memory device are provided. Provided is a plurality of gate electrodes and a plurality of insulating patterns alternately stacked on top of each other in a first direction, an information storage film formed along a sidewall of a trench, wherein the trench extends through the plurality of gate electrodes and the insulating patterns in the first direction, and a semiconductor pattern formed on the information storage film, wherein the semiconductor pattern is made of polycrystalline silicon composed of a first monocrystalline silicon and a second monocrystalline silicon, wherein a metal silicide is present in a grain boundary between the first monocrystalline silicon and the second monocrystalline silicon, wherein the metal silicide is absent in each of the first monocrystalline silicon and the second monocrystalline silicon except for the grain boundary therebetween.

20 Claims, 23 Drawing Sheets

(51) Int. Cl.

| | |
|---|---|
| ***H10B 41/27*** | (2023.01) |
| ***H10B 41/35*** | (2023.01) |
| ***H10B 41/40*** | (2023.01) |
| ***H10B 43/10*** | (2023.01) |
| ***H10B 43/35*** | (2023.01) |
| ***H10B 43/40*** | (2023.01) |
| ***H10B 80/00*** | (2026.01) |
| ***H10W 90/00*** | (2026.01) |

(52) U.S. Cl.
CPC ............. *H10B 41/40* (2023.02); *H10B 43/10* (2023.02); *H10B 43/35* (2023.02); *H10B 43/40* (2023.02); *H10B 80/00* (2023.02); *H10W 90/00* (2026.01); *H10W 90/752* (2026.01)

(58) Field of Classification Search
CPC ........ H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | |
|---|---|---|---|---|
| 9,627,395 | B2 | 4/2017 | Zhang et al. | |
| 9,929,178 | B1 | 3/2018 | Kaneko | |
| 9,960,178 | B2 | 5/2018 | Kawai et al. | |
| 2015/0162343 | A1* | 6/2015 | Park | H10B 43/50<br>257/329 |
| 2016/0268274 | A1* | 9/2016 | Kawai | H10B 43/27 |
| 2017/0345843 | A1* | 11/2017 | Lee | H01L 23/528 |
| 2018/0277219 | A1* | 9/2018 | Suematsu | H10B 43/40 |
| 2019/0267390 | A1 | 8/2019 | Hu et al. | |
| 2021/0296358 | A1 | 9/2021 | Kanamori et al. | |

FOREIGN PATENT DOCUMENTS

| | | | |
|---|---|---|---|
| KR | 10-2136849 | B1 | 7/2020 |
| KR | 10-2020-0132790 | A | 11/2020 |

* cited by examiner 2000
2001
2002
2003
2003a
2003b
2004
2005
2006
2100
2130
2200
2210
2300
2400
2500
3210
3220
I
I'

NONVOLATILE MEMORY DEVICE WITH MILC CHANNEL

CROSS-REFERENCE TO RELATED APPLICATION

This application claims priority under 35 U.S.C. § 119 from Korean Patent Application No. 10-2022-0102508, filed on Aug. 17, 2022, in the Korean Intellectual Property Office, and all the benefits accruing therefrom under 35 U.S.C. § 119, the contents of which in its entirety are herein incorporated by reference.

BACKGROUND

Field

The present disclosure relates to a nonvolatile memory device and a method for manufacturing the same. More specifically, the present disclosure relates to a nonvolatile memory device including a channel structure in which a channel is formed using MILC (Metal Induced Lateral Crystallization) and a method for manufacturing the same.

Description of Related Art

A semiconductor memory device may be largely classified into a volatile memory device and a nonvolatile memory device.

An integration of the nonvolatile memory device is increasing in order to satisfy high performance and low price demanded by consumers. However, in a two-dimensional or planar memory device, the integration is determined based on an area occupied by a unit memory cell. Accordingly, recently, a three-dimensional memory device in which unit memory cells are vertically arranged has been developed.

SUMMARY

A technical purpose of the present disclosure is to provide a nonvolatile memory device in which a metal trapped in a channel structure in which a channel is formed via MILC (Metal Induced Lateral Crystallization) is removed or reduced.

Another technical purpose of the present disclosure is to provide a method for manufacturing a nonvolatile memory device in which a metal trapped in a channel structure in which a channel is formed via MILC (Metal Induced Lateral Crystallization) is removed or reduced.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

According to an aspect of the present inventive concept, there is provided a nonvolatile memory device comprising, a plurality of gate electrodes and a plurality of insulating patterns alternately stacked in a first direction, an information storage film formed along a sidewall of a trench, wherein the trench extends through the plurality of gate electrodes and the insulating patterns in the first direction, and a semiconductor pattern formed on the information storage film, wherein the semiconductor pattern is made of polycrystalline silicon composed of a first monocrystalline silicon and a second monocrystalline silicon, wherein a metal silicide is present in a grain boundary between the first monocrystalline silicon and the second monocrystalline silicon, wherein the metal silicide is absent in each of the first monocrystalline silicon and the second monocrystalline silicon except for the grain boundary therebetween.

According to an aspect of the present inventive concept, there is provided a method for manufacturing a nonvolatile memory device, the method comprising, alternately stacking a plurality of gate electrodes and a plurality of insulating patterns in a first direction, forming a trench extending through the plurality of gate electrodes and the plurality of the insulating patterns in the first direction, forming an information storage film along a sidewall of the trench, forming a semiconductor pattern on the information storage film, forming a gettering layer on the semiconductor pattern, performing thermal treatment on the gettering layer, etching the gettering layer subjected to the thermal treatment, filling an inner space defined in the semiconductor pattern with a filling pattern, and forming a channel pad on the information storage film, the semiconductor pattern, and the filling pattern.

According to an aspect of the present inventive concept, there is provided a memory system comprising, a nonvolatile memory device including an input/output pad electrically connected to a peripheral circuit, and a NAND controller electrically connected to the nonvolatile memory device via the input/output pad and controlling the nonvolatile memory device, wherein the nonvolatile memory device includes, a plurality of gate electrodes and a plurality of insulating patterns alternately stacked in a first direction, an information storage film formed along a sidewall of a trench, wherein the trench extends through the plurality of gate electrodes and the insulating patterns in the first direction, and a semiconductor pattern formed on the information storage film, wherein the semiconductor pattern is made of polycrystalline silicon composed of a first monocrystalline silicon and a second monocrystalline silicon, wherein a metal silicide is present in a grain boundary between the first monocrystalline silicon and the second monocrystalline silicon, wherein the metal silicide is absent in each of the first monocrystalline silicon and the second monocrystalline silicon except for the grain boundary therebetween.

Specific details of other embodiments are included in detailed descriptions and drawings.

BRIEF DESCRIPTION OF DRAWINGS

The above and other aspects and features of the present disclosure will become more apparent by describing in detail illustrative embodiments thereof with reference to the attached drawings, in which.

DETAILED DESCRIPTIONS

Figure 1:
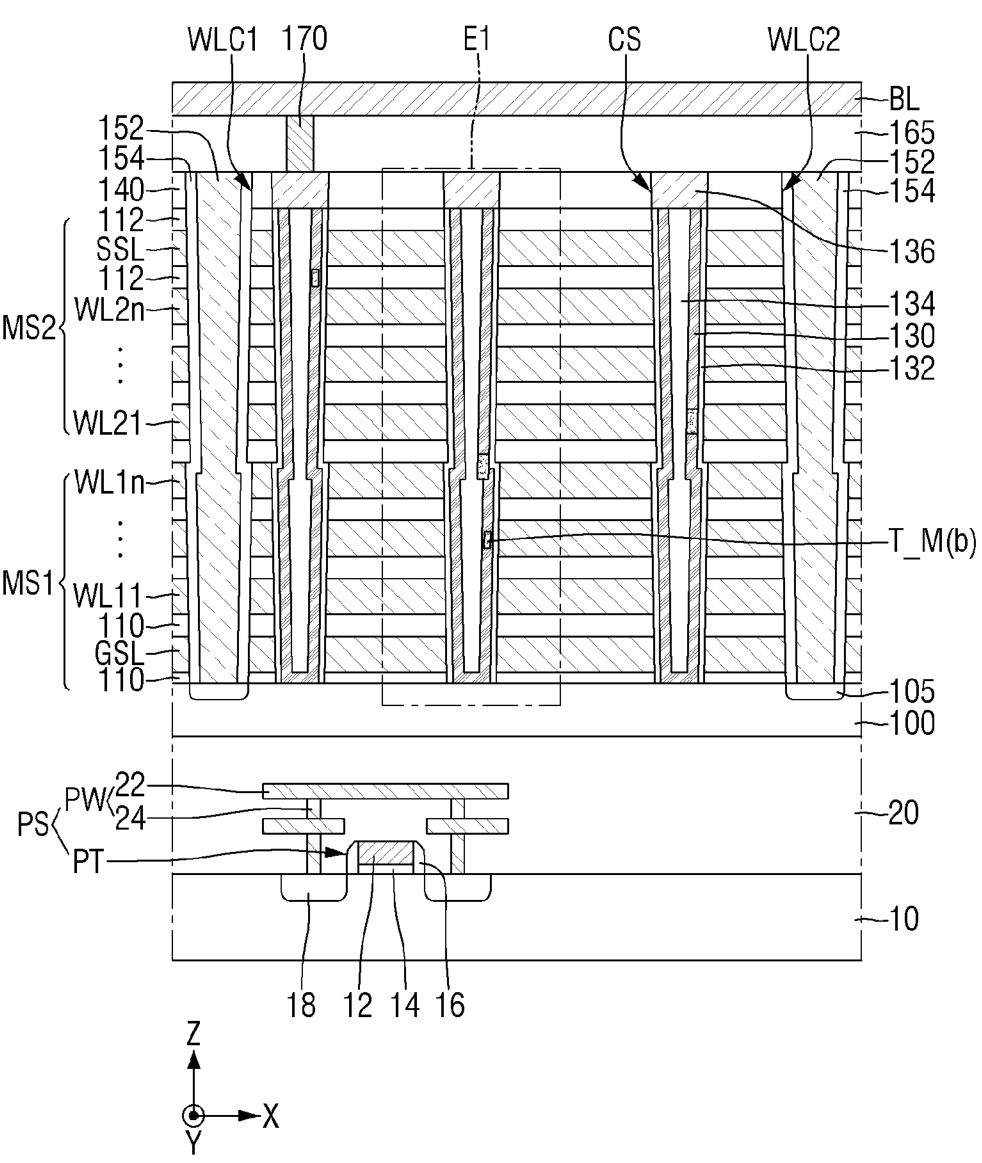
FIG. 1 is a diagram for illustrating a nonvolatile memory device according to some example embodiments.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating embodiments of the present disclosure are illustrative, and the present disclosure is not limited thereto.

The terminology used herein is for the purpose of describing particular embodiments only and is not intended to limit the present disclosure. As used herein, the singular forms “a” and “an” are intended to include the plural forms as well, unless the context clearly indicates otherwise. It will be further understood that the terms “comprises”, “comprising”, “includes”, and “including” when used in this specification, specify the presence of the stated features, integers, operations, elements, and/or components, but do not preclude the presence or addition of one or more other features, integers, operations, elements, components, and/or portions thereof. As used herein, the term “and/or” includes any and all combinations of one or more of the associated listed items. Expression such as “at least one of” when preceding a list of elements may modify the entirety of list of elements and may not modify the individual elements of the list. When referring to “C to D”, this means C inclusive to D inclusive unless otherwise specified.

It will be understood that, although the terms “first”, “second”, “third”, and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present “on” or “beneath” a second element or layer, the first element may be disposed directly on or beneath the second element or may be disposed indirectly on or beneath the second element with a third element or layer being disposed between the first and second elements or layers. It will be understood that when an element or layer is referred to as being “connected to”, or “coupled to” another element or layer, it may be directly on, connected to, or coupled to the other element or layer, or one or more intervening elements or layers may be present. In addition, it will also be understood that when an element or layer is referred to as being “between” two elements or layers, it may be the only element or layer between the two elements or layers, or one or more intervening elements or layers may also be present. As used herein, the term “contact” refers to a direct connection (i.e., touching) unless the context indicates otherwise.

Further, as used herein, when a layer, film, region, plate, or the like is disposed “on” or “on a top” of another layer, film, region, plate, or the like, the former may directly contact the latter or still another layer, film, region, plate, or the like may be disposed between the former and the latter. As used herein, when a layer, film, region, plate, or the like is directly disposed “on” or “on a top” of another layer, film, region, plate, or the like, the former directly contacts the latter and still another layer, film, region, plate, or the like is not disposed between the former and the latter. Further, as used herein, when a layer, film, region, plate, or the like is disposed “below” or “under” another layer, film, region, plate, or the like, the former may directly contact the latter or still another layer, film, region, plate, or the like may be disposed between the former and the latter. As used herein, when a layer, film, region, plate, or the like is directly disposed “below” or “under” another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings is turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

Figure 2:
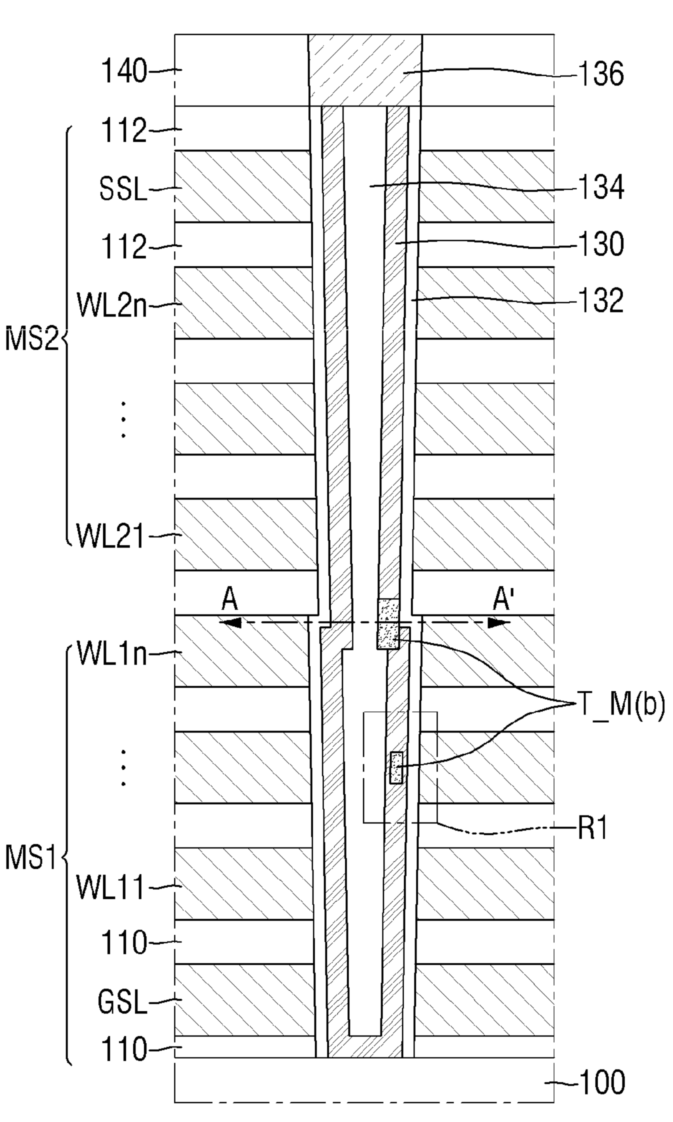
FIG. 2 is an enlarged view of area E1 of FIG. 1.
Figure 3:
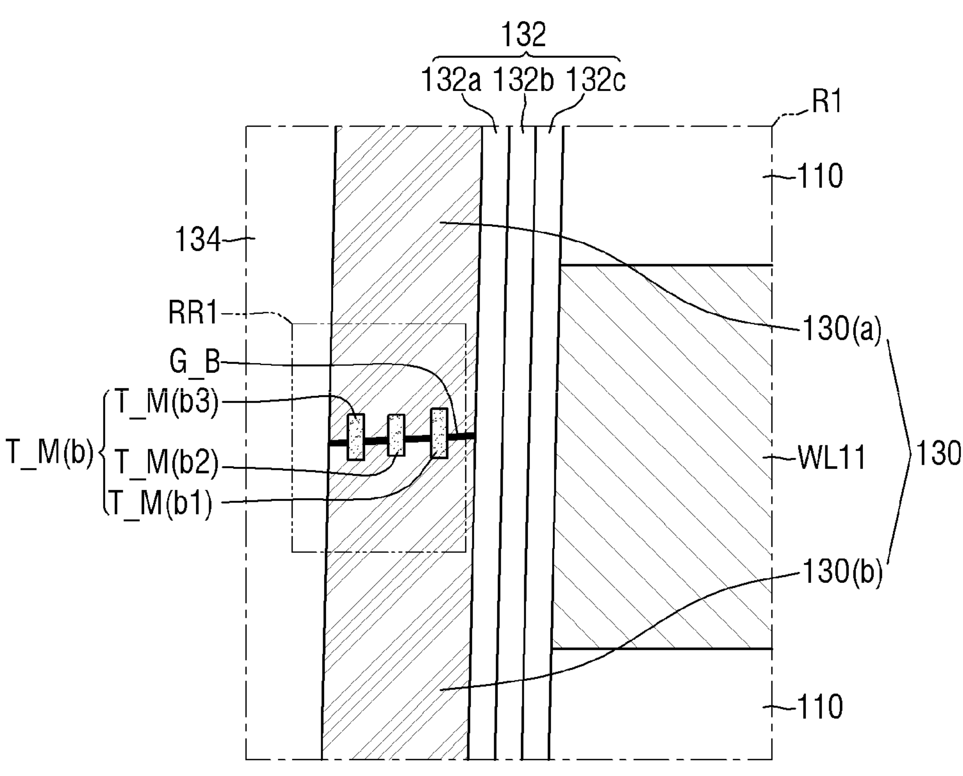
FIG. 3 is an enlarged view of area R1 of FIG. 2.
Figure 4:
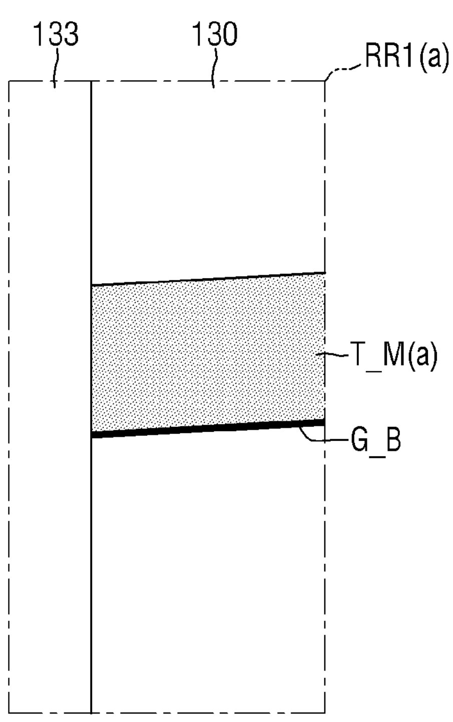
FIG. 4 to FIG. 6 are illustrative enlarged views of area RR1 to illustrate intermediate structures corresponding to intermediate steps of an example manufacturing process that removes or reduces a metal trapped in a semiconductor pattern of FIG. 3.
Figure 5:
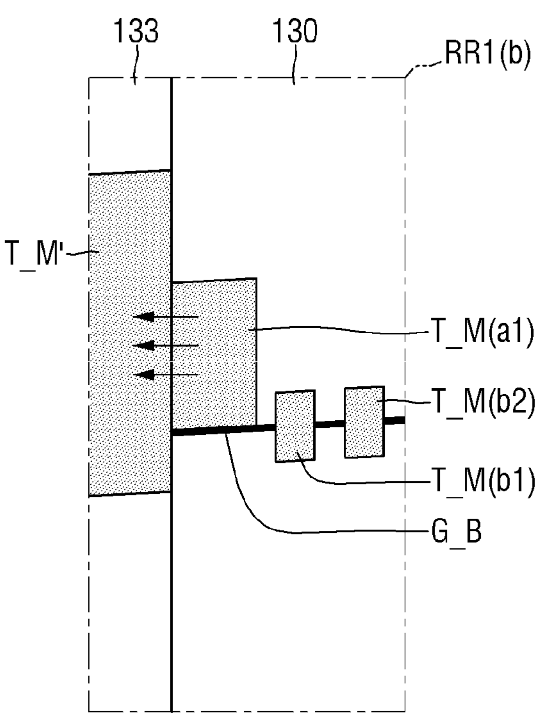
Figure 6:
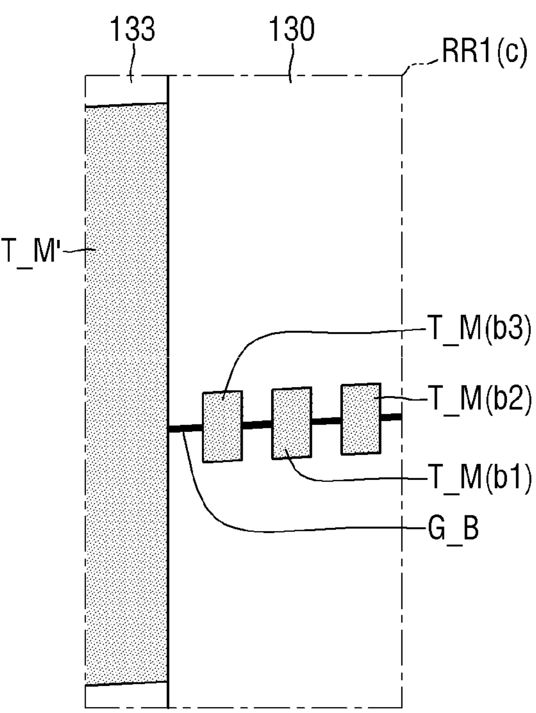
Figure 7:
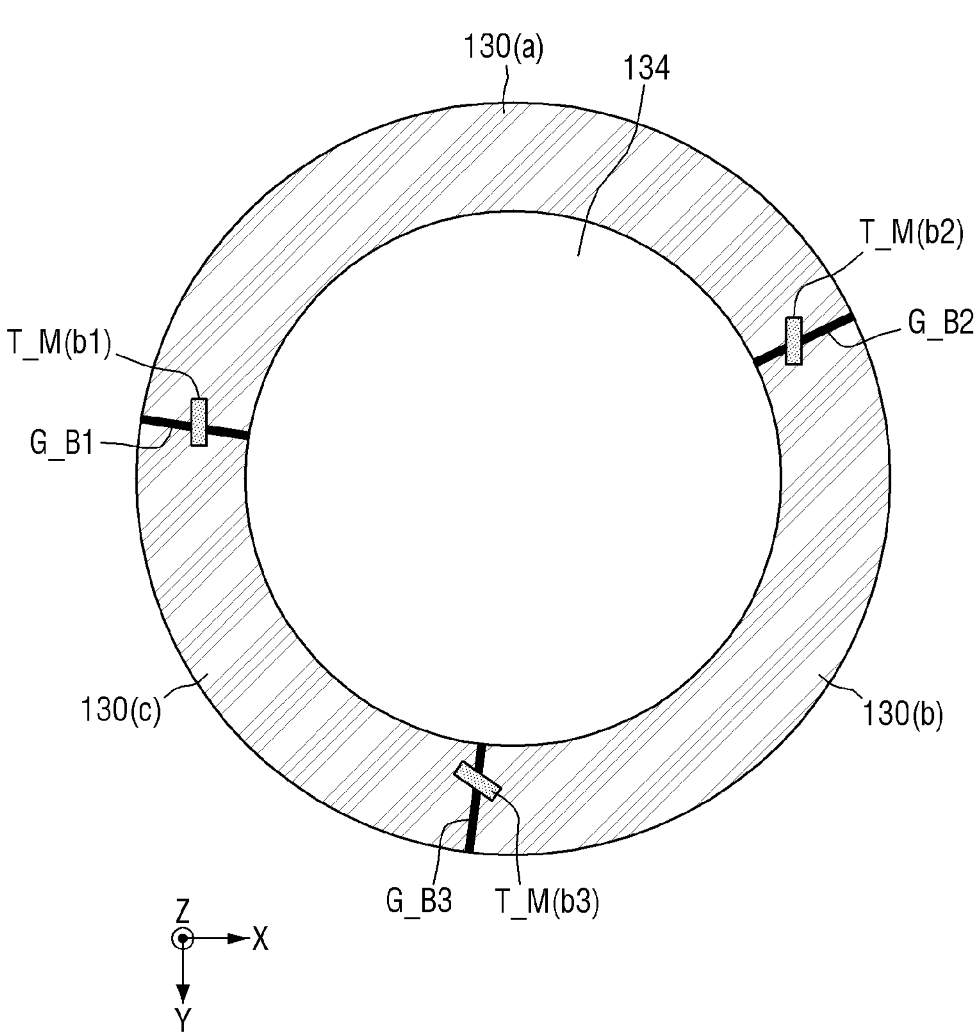
FIG. 7 is a top view of area A-A' of FIG. 2.

FIG. 1 is a diagram for illustrating a nonvolatile memory device according to some example embodiments. FIG. 2 is an enlarged view of area E1 of FIG. 1. FIG. 3 is an enlarged view of area R1 of FIG. 2. FIG. 4 to FIG. 6 are illustrative enlarged views of area RR1 to illustrate intermediate structures corresponding to intermediate steps of an example manufacturing process that removes or reduces a metal trapped in a semiconductor pattern of FIG. 3. FIG. 7 is atop view of area A-A' of FIG. 2.

Referring to FIG. 1 to FIG. 3, a nonvolatile memory device according to some example embodiments includes a substrate 100, a first mold structure MS1, a second mold structure MS2, a plurality of channel structures CS, and a plurality of bit-lines BL.

The substrate 100 may include, for example, a semiconductor substrate such as a silicon substrate, a germanium substrate, or a silicon-germanium substrate. Alternatively, the substrate 100 may include a silicon-on-insulator (SOI) substrate or a germanium-on-insulator (GOI) substrate, or the like.

The first mold structure MS1 may be formed on the substrate 100. The first mold structure MS1 may include a plurality of first gate electrodes GSL and WL11 to WL1*n* and a plurality of first insulating patterns 110 alternately stacked on top of each other while being disposed on the substrate 100. For example, each of the first gate electrodes GSL and WL11 to WL1*n* and each of the first insulating patterns 110 may have a layered structure extending lengthwise in a first direction X and a second direction Y. The first gate electrodes GSL and WL11 to WL1*n* and the first insulating patterns 110 may be alternately stacked on top of each other in a third direction Z that intersects (for example, perpendicular to) a top face of the substrate 100.

In some embodiments, the plurality of first gate electrodes GSL and WL11 to WL1*n* may include a ground select line GSL and a plurality of first word-lines WL11 to WL1*n* sequentially stacked on the substrate 100. In some embodiments, the ground select line GSL may be embodied as a lowermost gate electrode among the plurality of first gate electrodes GSL and WL11 to WL1*n*.

The second mold structure MS2 may be formed on the first mold structure MS1. The second mold structure MS2 may include a plurality of second gate electrodes WL21 to WL2*n* and SSL and a plurality of second insulating patterns 112 alternately stacked on top of each other while being disposed on the first mold structure MS1. For example, each of the second gate electrodes WL21 to WL2*n* and SSL and each of the second insulating patterns 112 may have a layered structure extending lengthwise in the first direction X and the second direction Y. The second gate electrode WL21 to WL2*n* and SSL and the second insulating patterns 112 may be alternately stacked on top of each other in the third direction Z.

In some embodiments, the plurality of second gate electrodes WL21 to WL2*n* and SSL may include a plurality of second word-lines WL21 to WL2*n* and a string select line SSL sequentially stacked on the first mold structure MS1. In some embodiments, the string select line SSL may be embodied as a topmost gate electrode among the plurality of second gate electrodes WL21 to WL2*n* and SSL.

Each of the first gate electrodes GSL and WL11 to WL1*n* and the second gate electrodes WL21 to WL2*n* and SSL may include a conductive material. For example, each of the first gate electrodes GSL and WL11 to WL1*n* and the second gate electrodes WL21 to WL2*n* and SSL may include a metal such as tungsten (W), cobalt (Co), or nickel (Ni), or a semiconductor material such as silicon. However, the present disclosure is not limited thereto.

Each of the first insulating pattern 110 and the second insulating pattern 112 may include an insulating material. For example, each of the first insulating pattern 110 and the second insulating pattern 112 may include silicon oxide. However, the present disclosure is not limited thereto.

The plurality of channel structures CS may extend through the first mold structure MST and the second mold structure MS2. Further, the plurality of channel structures CS may extend in a direction intersecting the plurality of gate electrodes GSL, WL11 to WL1*n*, WL21 to WL2*n*, and SSL. For example, each channel structure CS may have a pillar shape (for example, a cylindrical shape) extending in the third direction Z. Each channel structure CS may include a semiconductor pattern 130 and an information storage film 132.

The semiconductor pattern 130 may extend through the first mold structure MS1 and the second mold structure MS2. For example, the semiconductor pattern 130 may extend in the third direction Z. The semiconductor pattern 130 is illustrated as having a cup shape. However, this is only illustrative. For example, the semiconductor pattern 130 may have various shapes, such as a cylindrical shape, a rectangular pillar shape, and a solid pillar shape.

The semiconductor pattern 130 may be formed on the information storage film 132 via MILC (Metal Induced Lateral Crystallization). For example, the semiconductor pattern 130 is made of polycrystalline silicon including a plurality of monocrystalline silicon.

More specifically, the semiconductor pattern 130 may act as a channel layer formed via MILC (Metal Induced Lateral Crystallization). The semiconductor pattern 130 may be formed as follows: a silicon layer may be doped with O, C, and/or N to suppress self-crystallization and then nickel (Ni), cobalt (Co), and/or platinum (Pt) may be deposited thereon, and then thermal treatment is performed thereon. As a result, a metal silicide may be produced, and thus the silicon layer may be converted to a polycrystalline silicon layer.

For example, because the semiconductor pattern 130 is formed via MILC (Metal Induced Lateral Crystallization), the metal silicide may be trapped in the semiconductor pattern 130. The metal may be, for example, nickel (Ni), cobalt (Co), and/or platinum (Pt).

When the metal silicide trapped in the semiconductor pattern 130 is present, operation reliability of memory blocks including a string including the semiconductor pattern 130 in which the metal silicide is trapped may decrease.

Accordingly, in the nonvolatile memory device according to some example embodiments, the metal silicide trapped in the semiconductor pattern 130 may be removed or reduced, thereby improving the operational reliability of the memory blocks including the string including the semiconductor pattern 130.

Referring to FIG. 3 to FIG. 6, the semiconductor pattern 130 is made of the polycrystalline silicon including a first monocrystalline silicon 130(*a*) and a second monocrystalline silicon 130(*b*).

In accordance with the present disclosure, an example in which the semiconductor pattern 130 is made of the polycrystalline silicon including the first monocrystalline silicon 130(*a*) and the second monocrystalline silicon 130(*b*) is described. However, the present disclosure is not limited thereto, and the semiconductor pattern 130 may be made of the polycrystalline silicon including first to n-th monocrystalline silicon, wherein n is a natural number equal to or greater than 2.

In the nonvolatile memory device according to some embodiments, the metal silicide trapped in the semiconductor pattern 130 is removed or reduced, so that, as shown in FIG. 3, the metal silicide T_M(b) may be present only at a grain boundary G_B between the first monocrystalline silicon 130(*a*) and the second monocrystalline silicon 130(*b*).

An angle between a crystal plane of a solid-state physics related <111> direction of the first monocrystalline silicon 130(*a*) and a crystal plane of a solid-state physics related <111> direction of the second monocrystalline silicon 130(*b*) may be 109.5° or 70.5°.

For example, in the nonvolatile memory device according to some embodiments, the metal silicide trapped in the semiconductor pattern 130 is removed or reduced, so that, as shown in FIG. 3, there is no metal silicide in an area except for the grain boundary G_B between the first monocrystalline silicon 130(*a*) and the second monocrystalline silicon 130(*b*).

In the nonvolatile memory device according to some embodiments, the process of removing or reducing the metal silicide trapped in the semiconductor pattern 130 will be described in detail with reference to FIG. 4 to FIG. 6.

First, referring to FIG. 4, it is assumed that the metal silicide T_M(a) is trapped in the semiconductor pattern 130 polycrystallized via MILC (Metal Induced Lateral Crystallization).

To form the semiconductor pattern 130, nickel (Ni), cobalt (Co), and/or platinum (Pt) may be deposited on a silicon layer doped with O, C, and/or N, and then the thermal treatment is performed thereon. As a result, the metal silicide may be produced, and thus the silicon layer may be converted to a polycrystalline silicon layer. At this time, the metal silicide may be trapped in the semiconductor pattern 130.

For example, due to the metal silicide T_M(a) being unnecessarily trapped in the semiconductor pattern 130 polycrystallized via the MILC, the operation reliability of the memory blocks including the string including the semiconductor pattern 130 in which the metal silicide T_M(a) is trapped may be lowered.

Therefore, in order to remove or reduce the metal silicide trapped in the semiconductor pattern 130, a gettering layer 133 is formed on the semiconductor pattern 130.

The gettering layer 133 may be made of, for example, amorphous silicon doped with an impurity. For example, the gettering layer 133 may include an amorphous silicon doped with an impurity, such as, for example, phosphorus (P), arsenic (As), or boron (B). However, the present disclosure is not limited thereto. The gettering layer 133 may be made of, for example, undoped amorphous silicon.

Then, referring to FIG. 5, the thermal treatment is performed on the gettering layer 133. The thermal treatment may be embodied as, for example, RTA (Rapid Thermal Annealing) or batch annealing. Further, the thermal treatment may be performed at a temperature in a range of 600° C. to 800° C.

As the thermal treatment is performed on the gettering layer 133, at least a portion of the metal silicide T_M(a1) trapped in the semiconductor pattern 130 may migrate to the gettering layer 133.

In this regard, as a portion of the metal silicide T_M(a1) present far away from the gettering layer 133 preferentially migrates to the gettering layer 133, metal silicide T_M(b1) and metal silicide T_M(b2) may be present in an area of the grain boundary G_B adjacent to an area thereof via which the metal silicide T_M(a1) trapped in the semiconductor pattern 130 migrates toward the gettering layer 133.

For example, a sum of the metal silicide T_M' migrating to the gettering layer 133 in FIG. 5, the metal silicide T_M(b1) and the metal silicide T_M(b2) present in the grain boundary, and the metal silicide T_M(a1) trapped in the semiconductor pattern 130 may be equal to an amount of the metal silicide T_Ma initially trapped in the semiconductor pattern 130 shown in FIG. 4

Then, referring to FIG. 6, when the thermal treatment is performed until an entirety of the metal silicide T_M(a) trapped in the semiconductor pattern 130 as shown in FIG. 4 migrates to the gettering layer 133, the metal silicide T_M(b1), the metal silicide T_M(b2), and metal silicide T_M(b3) may be present only in the grain boundary G_B, and the metal silicide may not be present in an area other than the grain boundary G_B as shown in FIG. 6.

For example, under the thermal treatment on the gettering layer 133, the metal silicide T_M(a) trapped in the semiconductor pattern 130 as shown in FIG. 4 except for the metal silicide T_M(b1), the metal silicide T_M(b2), and the metal silicide T_M(b3) existing in the grain boundary G_B may migrate to the gettering layer 133, such that metal silicide T_M' may be present in the gettering layer 133.

For example, a sum of the metal silicide T_M' in FIG. 6 and the metal silicide T_M(b1), the metal silicide T_M(b2), and the metal silicide T_M(b3) existing in the grain boundary G_B may be equal to the amount of the metal silicide T_M(a) initially trapped in the semiconductor pattern 130 shown in FIG. 4.

After at least a portion of the metal silicide T_M(a) trapped in the semiconductor pattern 130 as shown in FIG. 4 migrates to the gettering layer 133, the thermal treatment is completed as shown in FIG. 6. Thereafter, the gettering layer 133 containing the metal silicide T_M' may be etched away to remove or reduce the metal silicide trapped in the semiconductor pattern 130 of the channel structure CS of the nonvolatile memory device according to some embodiments.

The above-mentioned fact may be identified based on the top view of a A-A' section of FIG. 2.

Referring to FIG. 7 as the top view of a A-A' section of FIG. 2, the semiconductor pattern 130 may be composed of the first monocrystalline silicon 130(*a*), the second monocrystalline silicon 130(*b*), and a third monocrystalline silicon 130(*c*) in a top view of the semiconductor pattern 130 in the channel structure CS in the third direction Z.

In accordance with the present disclosure, an example in which the semiconductor pattern 130 is made of the polycrystalline silicon including the first monocrystalline silicon 130(*a*), the second monocrystalline silicon 130(*b*), and the third monocrystalline silicon 130(*c*) is described. However, the present disclosure is not limited thereto, and the semiconductor pattern 130 may be made of the polycrystalline silicon including first to n-th monocrystalline silicon, where n is a natural number equal to or greater than 2.

A second grain boundary G_B2 may be present between the first monocrystalline silicon 130(*a*) and the second monocrystalline silicon 130(*b*). Further, a third grain boundary G_B3 may be present between the second monocrystalline silicon 130(*b*) and the third monocrystalline silicon 130(*c*). Further, a first grain boundary G_B1 may be present between the first monocrystalline silicon 130(*a*) and the third monocrystalline silicon 130(*c*).

In this regard, the process of FIG. 3 to FIG. 6 may be applied to the method for manufacturing the nonvolatile memory device according to some embodiments so that metal silicide T_M(b1), metal silicide T_M(b2), and metal silicide T_M(b3) may be present only in the grain boundaries G_B1, G_B2, and G_B3, respectively, while the trapped metal silicide may be absent in an area other than the grain boundaries.

Again, referring to FIG. 1 to FIG. 3, the information storage film 132 may be interposed between the semiconductor pattern 130 and each of the gate electrodes GSL, WL11 to WL1*n*, WL21 to WL2*n*, and SSL. For example, the information storage film 132 may extend along a side face of the semiconductor pattern 130. In example embodiments, the information storage film 132 may include a first blocking pattern 132*c*, a charge storage pattern 132*b*, and a tunnel insulation pattern 132*a* sequentially stacked.

The information storage film 132 may include, for example, at least one of silicon oxide, silicon nitride, silicon oxynitride, and a high dielectric constant material having a dielectric constant greater than that of silicon oxide. The high dielectric constant material may include, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

In some embodiments, each channel structure CS may further include a first filling pattern 134. The first filling pattern 134 may be formed to fill an inner space defined by the cup-shaped semiconductor pattern 130. For example, the semiconductor pattern 130 may extend along a side face and a bottom face of the first filling pattern 134. In example embodiments, upper surfaces of the semiconductor pattern 130 and the first filling pattern 134 may be coplanar. In addition, the upper surface of the first filling pattern 134 may be coplanar with an upper surface of the uppermost one of the second insulating patterns 112. The first filling pattern 134 may include, but is not limited to, silicon oxide.

In some embodiments, each channel structure CS may further include a channel pad 136. The channel pad 136 may be formed so as to be connected to a top of the semiconductor pattern 130. For example, the channel pad 136 may be formed in the first interlayer insulating film 140 formed on the mold structure MS. In example embodiments, a lower surface of the channel pad 136 may contact the upper surfaces of the semiconductor pattern 130 and the first filling pattern 134.

In FIG. 1, the channel pad 136 is illustrated to be formed on a top face of the semiconductor pattern 130. However, this is only an example. For example, a top portion of the semiconductor pattern 130 may be formed to extend along a side face of the channel pad 136. The channel pad 136 may include, for example, polysilicon doped with impurity. However, the present disclosure is not limited thereto.

Each channel structure CS comprised of the semiconductor pattern 130, the information storage film 132, the first filling pattern 134, and the channel pad 136 may be a memory channel structure.

In some embodiments, a width of a portion of the channel structure CS extending through the first mold structure MS1 may decrease as the portion of the channel structure CS extends toward a top face of the substrate 100. Further, a width of a portion of the channel structure CS extending through the second mold structure MS2 may decrease as the portion of the channel structure CS extends toward the top face of the substrate 100. This may be due to characteristics of an etching process for forming the channel structure CS.

In some embodiments, a width of a portion of the channel structure CS extending through a top face of the first mold structure MS1 may be greater than a width of a portion of the channel structure CS extending through a bottom face of the second mold structure MS2. This may be due to that an etching process to form a trench extending through the first mold structure MS1 and an etching process to form a trench extending through the second mold structure MS2 are separately performed.

Unlike what is illustrated, in some embodiments, a width of the channel structure CS may gradually decrease as the channel structure CS extends in a direction from a top face of the second mold structure MS2 toward a bottom face of the first mold structure MS1. For example, the etching process to form the trench extending through the first mold structure MS1 and the etching process to form the trench extending through the second mold structure MS2 may be performed simultaneously.

The plurality of bit-lines BL may be spaced apart from each other and may extend lengthwise in a parallel manner to each other. For example, each bit-line BL may extend lengthwise in the first direction X. In some embodiments, the plurality of bit-lines BL may be formed on the second mold structure MS2.

Each bit-line BL may be connected to at least one of the plurality of channel structures CS. For example, as shown in FIG. 1, the bit-line BL may be connected to the plurality of channel structures CS via bit-line contacts 170. The bit-line contacts 170 may extend through, for example, the second interlayer insulating film 165 so as to electrically connect the bit-line BL and the channel structure CS to each other.

Each of the first mold structure MS1 and the second mold structure MS2 may be cut by a first word-line trench WLC1 and a second word-line trench WLC2. The first word-line trench WLC1 and the second word-line trench WLC2 may extend lengthwise in a direction intersecting the bit-line BL. For example, the first word-line trench WLC1 may extend lengthwise in the second direction Y so as to cut each of the first mold structure MST and the second mold structure MS2. The second word-line trench WLC2 may be spaced apart from the first word-line trench WLC1 in the first direction X and may extend lengthwise in the second direction Y so as to cut each of the first mold structure MS1 and the second mold structure MS2.

Accordingly, each of the plurality of first gate electrodes GSL and WL11 to WL1*n* and the plurality of second gate electrodes WL21 to WL2*n* and SSL may be cut by the first word-line trench WLC1 and the second word-line trench WLC2.

In some embodiments, as shown in FIGS. 1 and 2, a width of a portion of each of the first word-line trench WLC1 and the second word-line trench WLC2 cutting the first mold structure MS1 may decrease as the portion of each of the first word-line trench WLC1 and the second word-line trench WLC2 extends toward the top face of the substrate 100. Further, a width of a portion of each of the first word-line trench WLC1 and the second word-line trench WLC2 cutting the second mold structure MS2 may decrease as the portion of each of the first word-line trench WLC1 and the second word-line trench WLC2 extends toward the top face of the substrate 100. This may be due to characteristics of the etching process for forming the first word-line trench WLC1 and the second word-line trench WLC2.

In some embodiments, a width of a portion of each of the first word-line trench WL C1 and the second word-line trench WLC2 cutting the top face of the first mold structure MS1 may be larger than a width of a portion of each of the first word-line trench WLC1 and the second word-line trench WLC2 cutting the bottom face of the second mold structure MS2. This may be due to that an etching process for cutting the first mold structure MS1 and an etching process for cutting the second mold structure MS2 are separately performed.

Referring back to FIG. 1, the nonvolatile memory device according to some embodiments further includes a base substrate 10 and a peripheral circuit structure PS.

The base substrate 10 may include, for example, a semiconductor substrate such as a silicon substrate, a germanium substrate, or a silicon-germanium substrate. Alternatively, the base substrate 10 may include a silicon-on-insulator (SOI) substrate, a germanium-on-insulator (GOI) substrate, etc.

The peripheral circuit structure PS may be formed on the base substrate 10. The peripheral circuit structure PS may constitute a peripheral circuit that controls an operation of each memory cell. For example, the peripheral circuit may include a row decoder, a column decoder, a page buffer, and a control circuit. For example, as shown in FIG. 1, the peripheral circuit structure PS may include a peripheral circuit element PT and a wiring structure PW.

In some embodiments, the peripheral circuit element PT may act as a transistor. For example, the peripheral circuit element PT may include a peripheral circuit gate electrode 12, a peripheral circuit gate insulating film 14, a gate spacer 16, and a source/drain area 18.

In some embodiments, the peripheral circuit element PT may act as a high voltage transistor. Although only an example in which the peripheral circuit element PT acts as the transistor is described, this is merely illustrative and the technical spirit of the present disclosure is not limited thereto. For example, the peripheral circuit element PT may act as not only each of various active elements such as a transistor, etc., but also each of various passive elements such as a capacitor, a resistor, and an inductor, etc.

In some embodiments, a third interlayer insulating film 20 may be formed on the base substrate 10. The third interlayer insulating film 20 may be formed on the base substrate 10 so as to cover the peripheral circuit element PT. Although the third interlayer insulating film 20 is illustrated to be embodied as a single film, this is only for convenience of illustration. In another example, the third interlayer insulating film 20 may be embodied as a multi-layer in which a plurality of insulating films are stacked. The third interlayer insulating film 20 may include, for example, silicon oxide. However, the present disclosure is not limited thereto.

The wiring structure PW may include peripheral circuit wirings 22 and peripheral circuit contacts 24. The peripheral circuit wirings 22 and the peripheral circuit contacts 24 may be formed, for example, in the third interlayer insulating film 20. The peripheral circuit wirings 22 may be connected to the peripheral circuit element PT via the peripheral circuit contacts 24.

The peripheral circuit wiring 22 may include, for example, a metal such as copper (Cu) or aluminum (Al). However, the present disclosure is not limited thereto. The peripheral circuit contacts 24 may include, for example, silicon such as polysilicon, or metal such as tungsten (W) or copper (Cu). However, the present disclosure is not limited thereto.

FIG. 8 to FIG. 12 are diagrams of intermediate structures corresponding to intermediate steps for illustrating a method of manufacturing a nonvolatile memory device according to some example embodiments.

Hereinafter, for the sake of simplification of description, a description duplicated with the above description is omitted.

Figure 8:
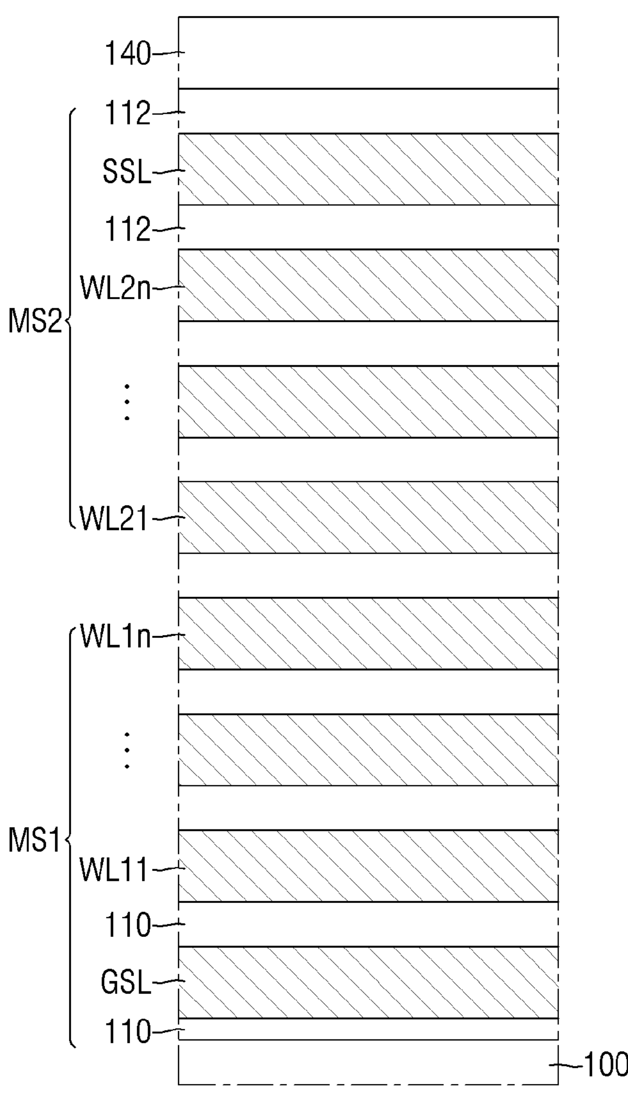
FIG. 8 to FIG. 12 are diagrams of intermediate structures corresponding to intermediate steps for illustrating a method of manufacturing a nonvolatile memory device according to some example embodiments.

First, referring to FIG. 8, the first mold structure MS1 and the second mold structure MS2 are sequentially stacked on the substrate 100.

In this regard, the first mold structure MS1 may include the plurality of first gate electrodes GSL and WL11 to WL1*n* and the plurality of first insulating patterns 110 alternately stacked on top of each other while being disposed on the substrate 100.

The second mold structure MS2 may be formed on the first mold structure MS1. The second mold structure MS2 may include the plurality of second gate electrodes WL21 to WL2*n* and SSL and the plurality of second insulating patterns 112 alternately stacked on top of each other while being disposed on the first mold structure MS1. Next, the interlayer insulating film 140 may be formed on an uppermost one of the second insulating patterns 112 of the second mold structure MS2.

Figure 9:
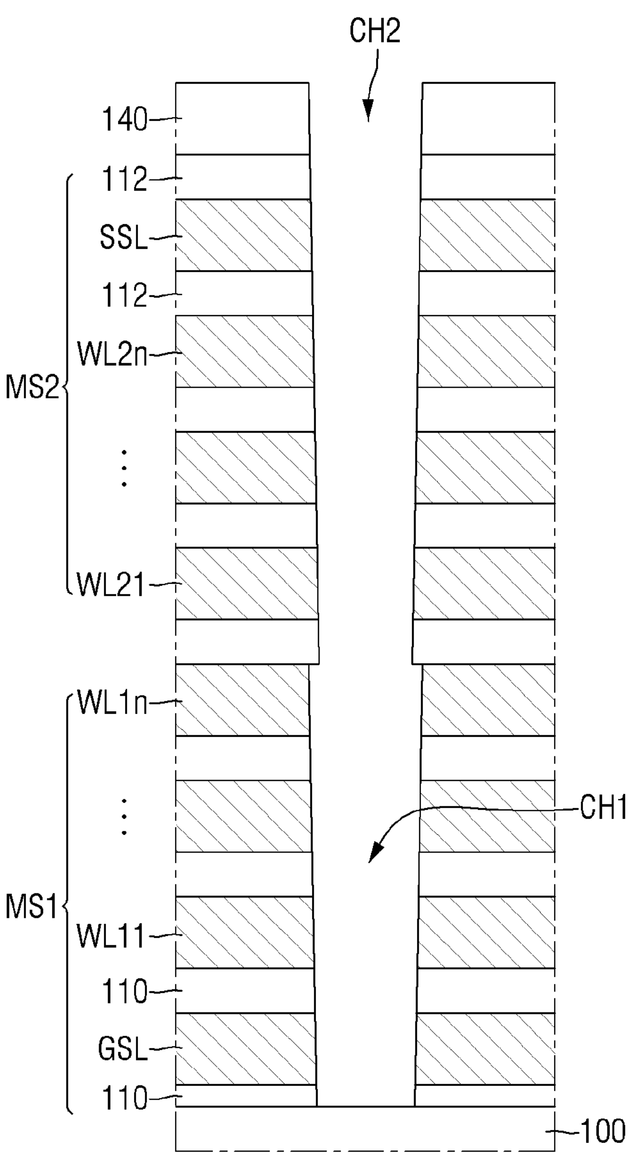

Thereafter, referring to FIG. 9, a trench CH1 extending through the first mold structure MS1 and a trench CH2 extending through the second mold structure MS2 may be formed.

Figure 10:
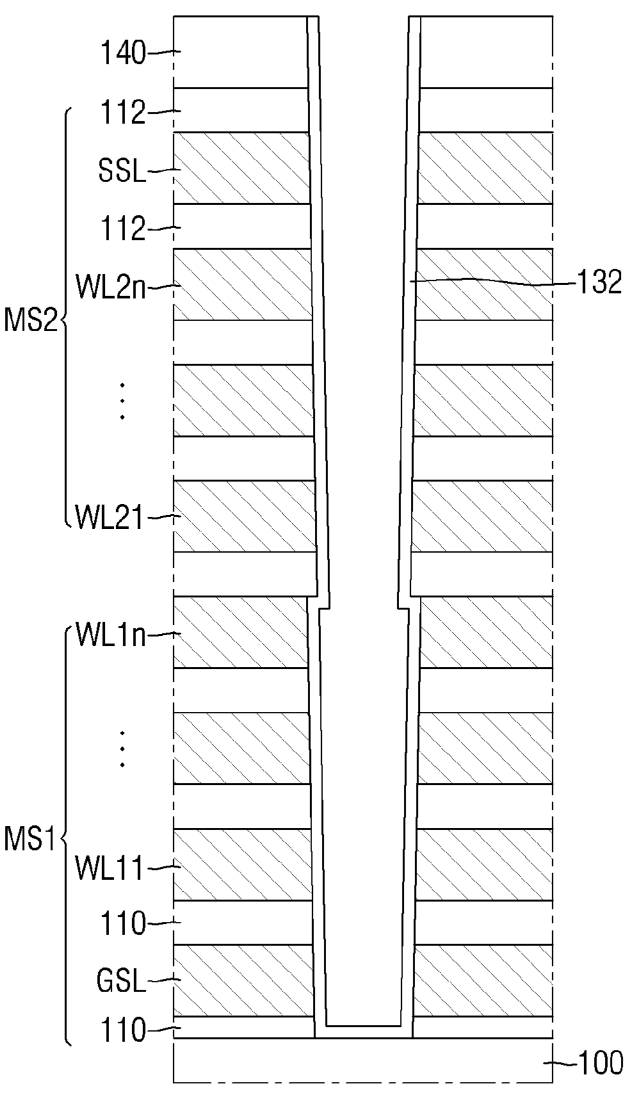

Then, referring to FIG. 10, the information storage film 132 is formed along a sidewall of each of the trenches CH1 and CH2. For example, the information storage film 132 may be conformally formed along the sidewall of each of the trenches CH1 and CH2.

Figure 11:
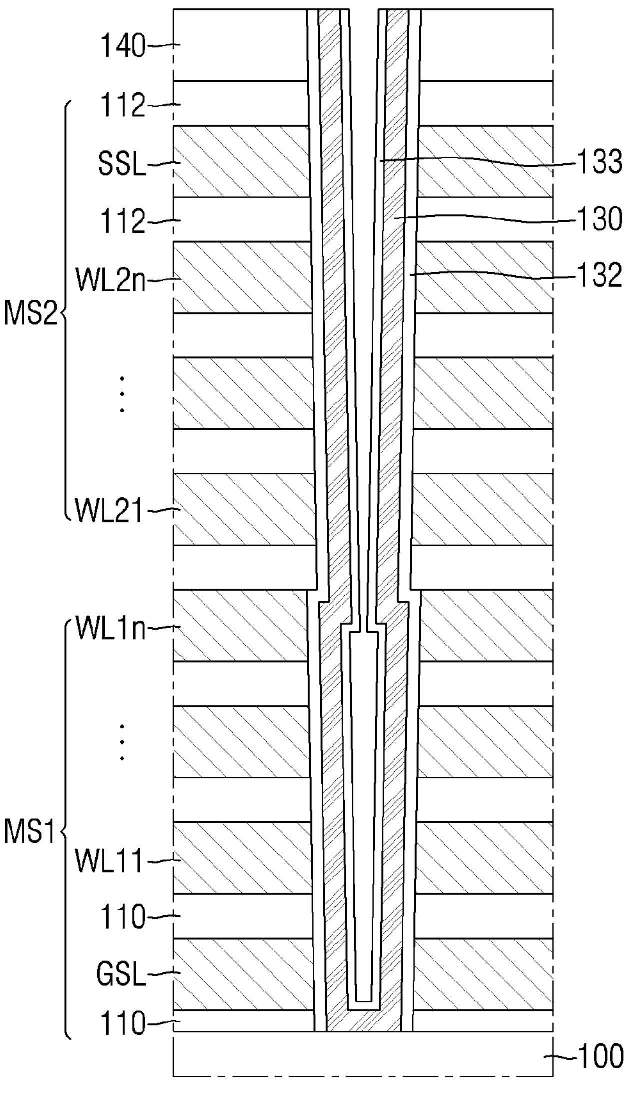

Then, referring to FIG. 11, a bottom face of the information storage film 132 where the information storage film 132 and the substrate 100 contact each other is etched and then the semiconductor pattern 130 is sequentially formed on the information storage film 132 and the substrate 100. For example, the semiconductor pattern 130 may be conformally formed on the substrate 100 and the information storage film 132. The semiconductor pattern 130 may contact the substrate 100 and the information storage film 132.

Thereafter, the gettering layer 133 is formed on the semiconductor pattern 130. For example, the gettering layer 133 may be conformally formed on the semiconductor pattern 130.

An example of a process in which the gettering layer 133 is formed on the semiconductor pattern 130 in FIG. 11 may be described above with reference to FIGS. 4 to 6.

In this regard, the present disclosure is not limited to FIG. 11. Alternatively, in the method for manufacturing the nonvolatile memory device according to some embodiments, a spacer layer 135 may be formed on the semiconductor pattern 130 as shown in FIG. 12.

For example, the spacer layer 135 may be conformally formed on the semiconductor pattern 130. The spacer layer 135 may include silicon oxide, nitride, or silicon carbon. In this regard, the gettering layer 133 may be formed on the spacer layer 135. The spacer layer 135 may serve as an etch stop layer when the gettering layer 133 is etched.

Thereafter, the thermal treatment is performed on the gettering layer 133 such that an entirety of the metal silicide trapped in the semiconductor pattern 130 migrates to the gettering layer 133. Then, the gettering layer 133 or both the gettering layer 133 and the spacer layer 135 may be etched. Then, the first filling pattern 134, the channel pad 136, and the interlayer insulating film 140 may be formed. In this way, the nonvolatile memory device as shown in FIG. 2 may be manufactured.

Figure 12:
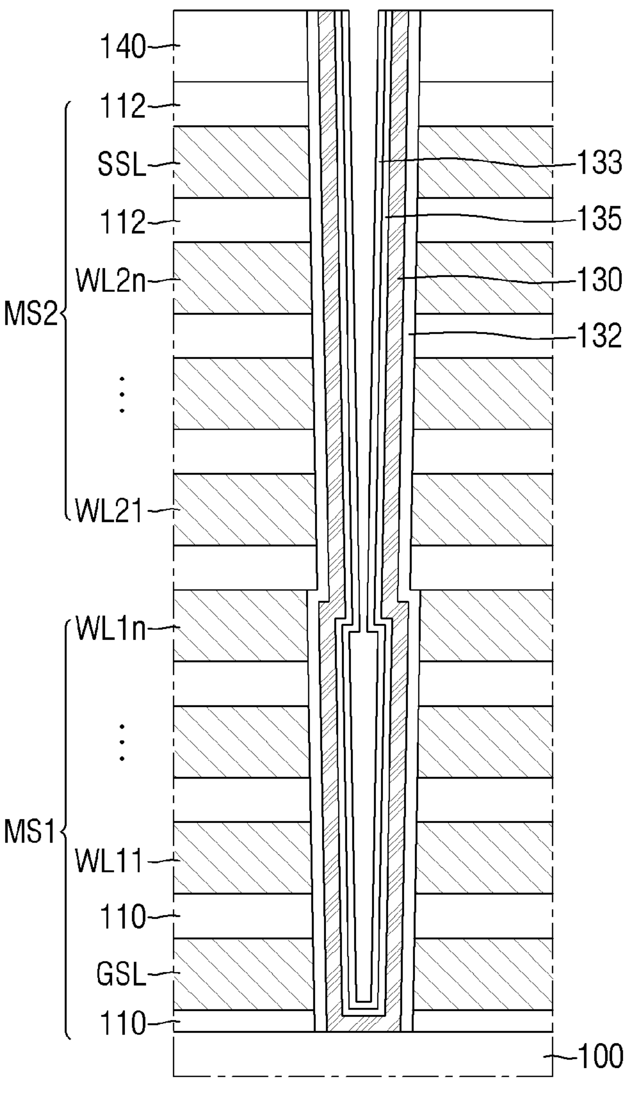

In this regard, in the method for manufacturing the nonvolatile memory device according to some example embodiments, when the spacer layer 135 is formed on the semiconductor pattern 130 as shown in FIG. 12, a following process may be performed. As in the nonvolatile memory device of FIG. 13 according to some embodiments, the thermal treatment is performed on the gettering layer 133 such that the entirety of the metal silicide trapped in the semiconductor pattern 130 migrates to the gettering layer 133, and then only the gettering layer 133 is etched, while the spacer layer 135 remains on the semiconductor pattern 130.

Figure 13:
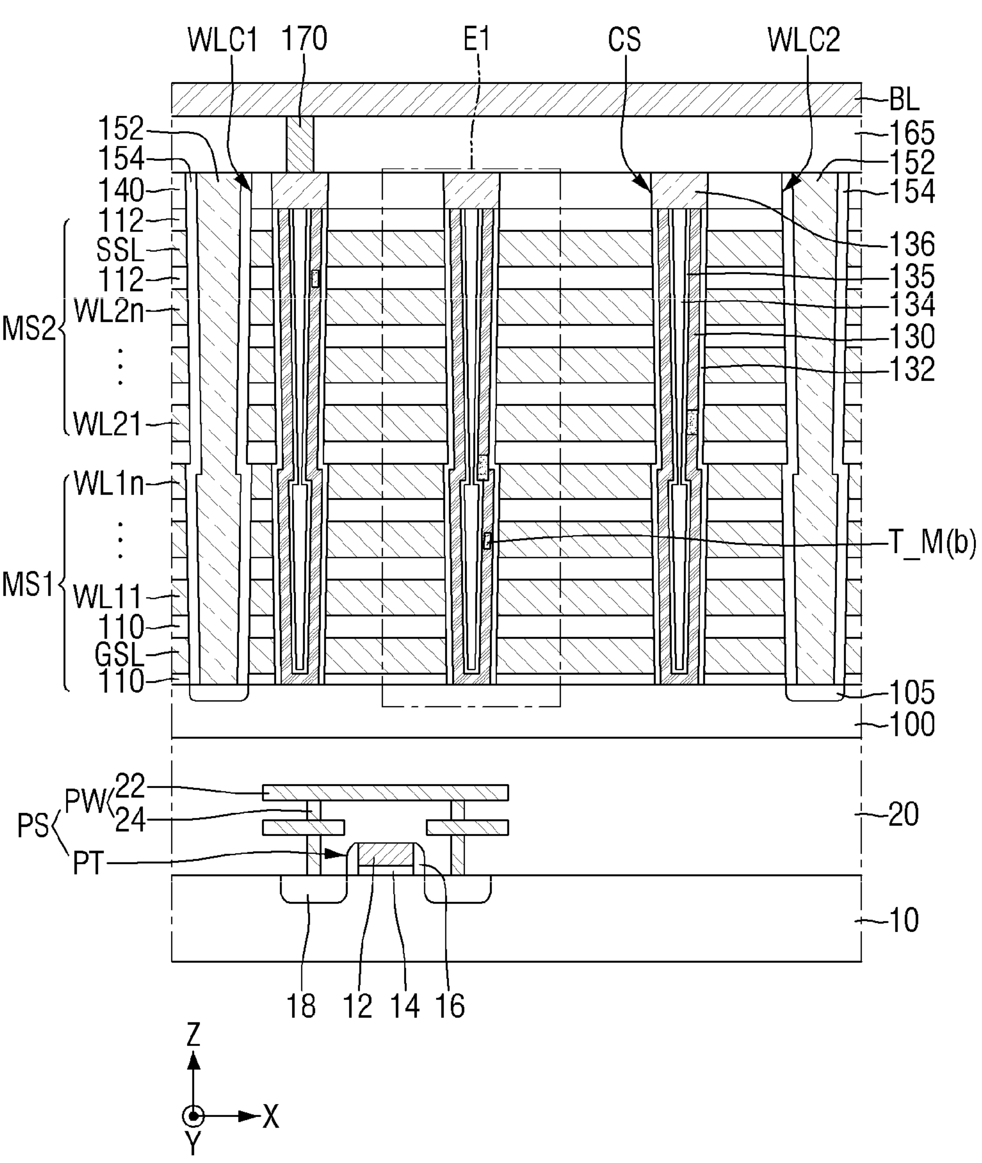
FIG. 13 is a diagram for illustrating a nonvolatile memory device according to some example embodiments.

As shown in FIG. 13, the thermal treatment is performed on the gettering layer 133 such that the entirety of the metal silicide trapped in the semiconductor pattern 130 migrates to the gettering layer 133. Then, only the gettering layer 133 is etched, while the spacer layer 135 remains on the semiconductor pattern 130. This example of FIG. 13 may be applied to following other embodiments.

Figure 14:
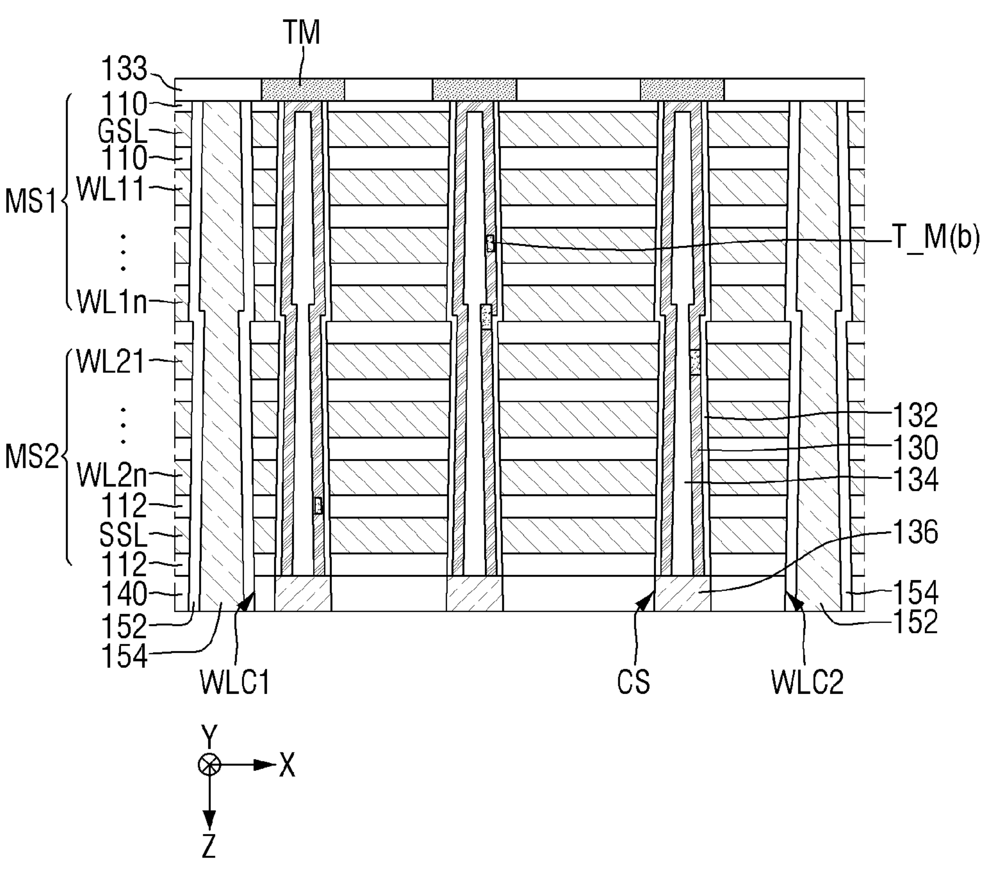
FIG. 14 is a diagram of an intermediate structure corresponding to an intermediate step for illustrating another method for manufacturing a nonvolatile memory device according to some example embodiments.

FIG. 14 is a diagram of an intermediate structure corresponding to an intermediate step for illustrating another method for manufacturing a nonvolatile memory device according to some example embodiments.

Referring to FIG. 14, unlike the method as described above with reference to FIG. 1 to FIG. 11, the gettering layer 133 may not be formed in the channel structure CS.

For example, the gettering layer 133 is formed on a bottom face of each of the channel structures CS extending in the third direction Z, and then the thermal treatment is performed such that an entirety of the metal silicide TM trapped in the semiconductor pattern 130 migrates to the gettering layer 133.

In the method for manufacturing the nonvolatile memory device according to FIG. 14, the metal silicide trapped in the semiconductor pattern 130 migrates to the gettering layer 133, as described above with reference to FIG. 1 to FIG. 11. Thus, the metal silicide T_M(b) may be present only in the grain boundary in the semiconductor pattern 130.

After the thermal treatment has been carried out on the gettering layer 133, the entirety of the metal silicide TM has migrated to the gettering layer 133. Then, the gettering layer 133 may be removed and then the substrate 100 may be placed into a location where the gettering layer 133 has been removed. In this way, the nonvolatile memory device as shown in FIG. 1 may be manufactured.

Figure 15:
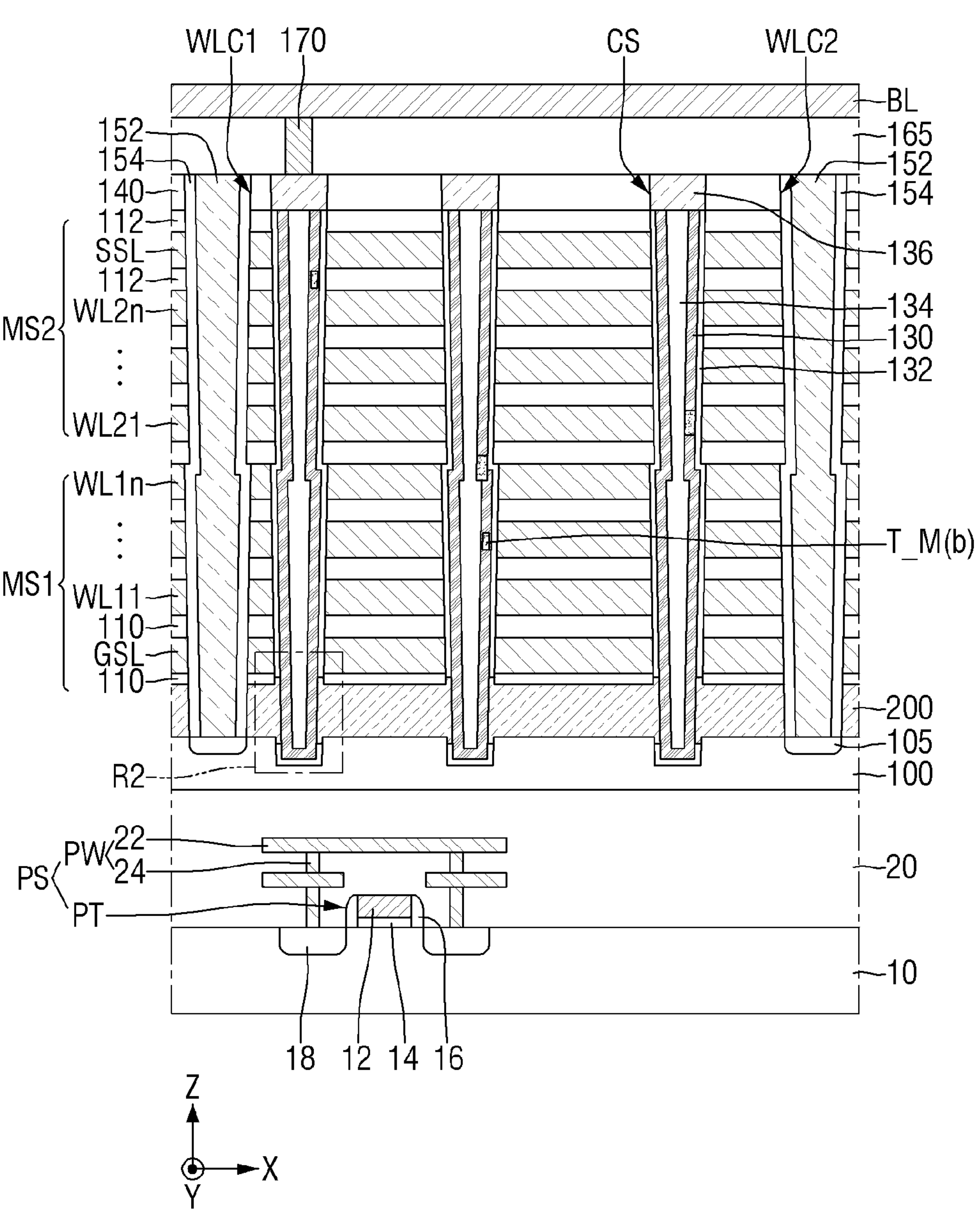
FIG. 15 is a diagram for illustrating another nonvolatile memory device according to some example embodiments.
Figure 16:
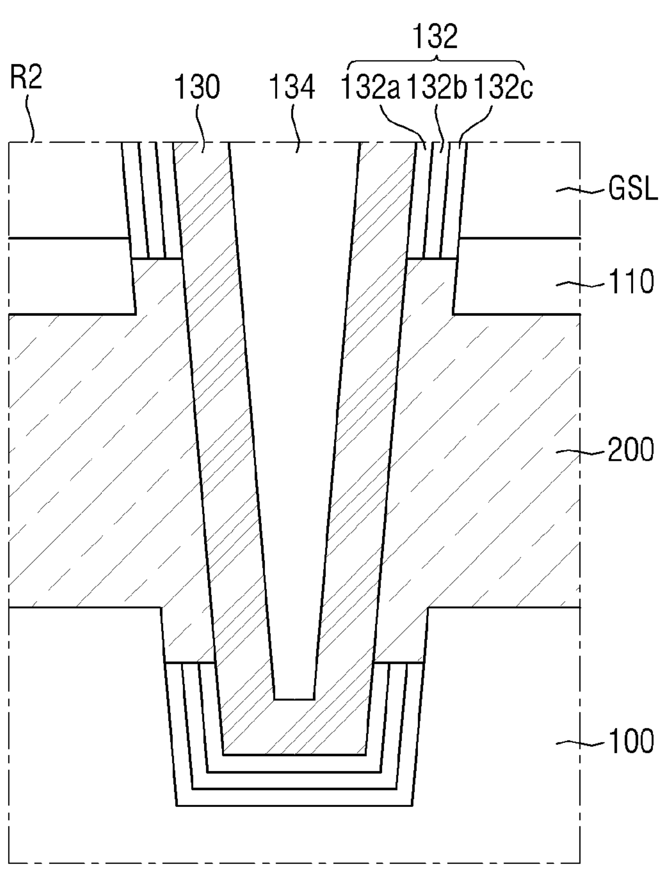
FIG. 16 is an enlarged view of area R2 of FIG. 15.

FIG. 15 is a diagram for illustrating another nonvolatile memory device according to some example embodiments. FIG. 16 is an enlarged view of area R2 of FIG. 15.

Descriptions duplicate with those as set forth above using FIG. 1 to FIG. 14 are briefly made or omitted.

Referring to FIG. 15 and FIG. 16, the nonvolatile memory device according to some embodiments further includes a source structure 200.

The source structure 200 may be formed on the substrate 100. In some embodiments, the source structure 200 may be interposed between the substrate 100 and the first mold structure MS1. The source structure 200 may include a conductive material. For example, the source structure 200 may include impurity-doped polysilicon or metal.

In some embodiments, each channel structure CS may extend through the source structure 200 and be connected to the substrate 100. For example, as shown in FIG. 15, the substrate 100 may have a substrate trench defined therein. A bottom portion of each channel structure CS may fill the substrate trench. In some embodiments, the information storage film 132 of each channel structure CS may extend along a side face and a bottom face of the substrate trench.

In some embodiments, the source structure 200 may be formed to be connected to the semiconductor pattern 130 of each channel structure CS. For example, the source structure 200 may extend through a portion of the information storage film 132 and may be in contact with the semiconductor pattern 130.

In some embodiments, a portion of the source structure 200 adjacent to the semiconductor pattern 130 may have a shape protruding toward the information storage film 132. For example, as shown in FIG. 16, in an area of the source structure 200 adjacent to the semiconductor pattern 130, a length by which the source structure 200 extends in the third direction Z may be relatively larger than that in an area thereof other than the area adjacent to the semiconductor pattern 130. This may be due to characteristics of the etching process for removing the portion of the information storage film 132 to form the source structure 200.

The nonvolatile memory device of FIG. 15 according to some embodiments may be manufactured using the manufacturing method as described above with reference to FIG. 1 to FIG. 14 such that the metal silicide trapped in the semiconductor pattern 130 may be reduced or removed while only the metal silicide T_M(b) may be present in the grain boundary of the semiconductor pattern 130.

Figure 17:
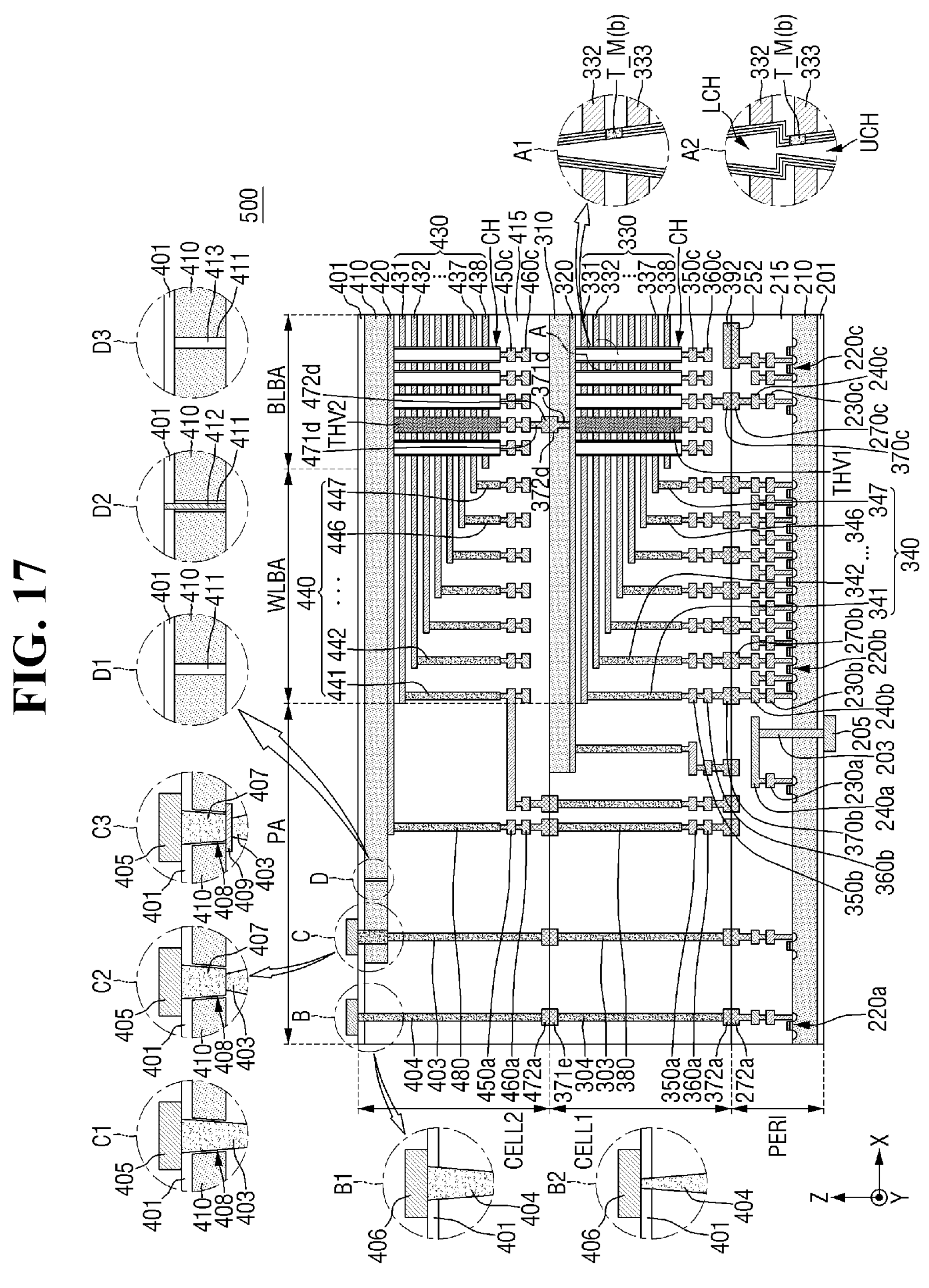
FIG. 17 is a diagram for illustrating still another nonvolatile memory device according to some example embodiments.

FIG. 17 is a diagram for illustrating still another nonvolatile memory device according to some example embodiments.

Descriptions duplicate with those as set forth above using FIG. 1 to FIG. 16 are briefly made or omitted.

Referring to FIG. 17, a nonvolatile memory device 500 may have a C2C (chip-to-chip) structure. In this regard, the C2C structure may refer to a structure in which at least one upper chip including a memory cell area CELL is disposed on a first wafer and a lower chip including a peripheral circuit area PERI is disposed on a second wafer different from the first wafer, and then the upper chip and the lower chip are connected to each other in a bonding scheme. In one example, the bonding scheme means a scheme for electrically connecting a first bonding metal formed in an uppermost metal layer of the upper chip and a second bonding metal formed in an uppermost metal layer of the lower chip to each other. For example, when each of the first bonding metal and the second bonding metal is made of copper (Cu), the bonding scheme may be embodied as a Cu—Cu bonding scheme. However, this is merely an example. In another example, each of the first bonding metal and the second bonding metal may be made of various other metals such as aluminum (Al) or tungsten (W).

The nonvolatile memory device 500 may include the at least one upper chip including the cell area CELL. For example, as shown in FIG. 17, the nonvolatile memory device 500 may be implemented to include two upper chips. However, this is only an example, and the number of the upper chips is not limited thereto. When the nonvolatile memory device 500 is implemented to include two upper chips, a first upper chip including a first cell area CELL1, a second upper chip including a second cell area CELL2, and the lower chip including the peripheral circuit area PERI may be individually manufactured. Then, the first upper chip, the second upper chip, and the lower chip may be bonded to each other in the bonding scheme. Thus, the nonvolatile memory device 500 may be manufactured. The first upper chip may be turned upside down and then may be connected to the lower chip in the bonding scheme, and the second upper chip may be turned upside down and then may connected to the first upper chip in the bonding scheme. In following descriptions, a top and a bottom of each of the first and second upper chips are defined based on a state before each of the first upper chip and the second upper chip is turned upside down. For example, in FIG. 17, the top of the lower chip means a top defined in a +Z-axis direction, and the top of each of the first and second upper chips means a top defined in a −Z-axis direction. However, this is only an example, and only one of the first upper chip and the second upper chip may be turned upside down and may be connected to a corresponding chip in the bonding scheme.

Each of the peripheral circuit area PERI and the first and second cell areas CELL1 and CELL2 of the nonvolatile memory device 500 may include an outer pad bonding area PA, a word-line bonding area WLBA, and a bit-line bonding area BLBA.

The peripheral circuit area PERI may include a first substrate 210 and a plurality of circuit elements 220*a*, 220*b*, and 220*c* formed on the first substrate 210. An interlayer insulating layer 215 including one or more insulating layers may be disposed on the plurality of circuit elements 220*a*, 220*b*, and 220*c*. A plurality of metal wirings connecting the plurality of circuit elements 220*a*, 220*b*, and 220*c* to each other may be disposed in the interlayer insulating layer 215. For example, the plurality of metal wirings may include first metal wirings 230*a*, 230*b*, and 230*c* connected to the plurality of circuit elements 220*a*, 220*b*, and 220*c*, respectively, and second metal wirings 240*a*, 240*b*, and 240*c* formed on the first metal wiring 230*a*, 230*b*, and 230*c*, respectively. The plurality of metal wirings may be made of at least one of various conductive materials. For example, the first metal wirings 230*a*, 230*b*, and 230*c* may be made of tungsten (W) having a relatively high electrical resistivity, while the second metal wirings 240*a*, 240*b*, and 240*c* may be made of copper (Cu) having a relatively low electrical resistivity.

In accordance with the present disclosure, only the first metal wirings 230*a*, 230*b*, and 230*c* and the second metal wirings 240*a*, 240*b*, and 240*c* are shown and described. However, the present disclosure is not limited thereto, and at least one additional metal wiring may be further formed on each of the second metal wirings 240*a*, 240*b*, and 240*c*. In this case, the second metal wirings 240*a*, 240*b*, and 240*c* may be made of aluminum. In addition, at least some of the additional metal wirings respectively formed on the second metal wirings 240*a*, 240*b*, and 240*c* may be made of copper (Cu) having an electrical resistivity lower than that of aluminum of the second metal wirings 240*a*, 240*b*, and 240*c*.

The interlayer insulating layer 215 may be disposed on the first substrate 210, and may include an insulating material such as silicon oxide or silicon nitride.

Each of the first and second cell areas CELL1 and CELL2 may include at least one memory block. The first cell area CELL1 may include a second substrate 310 and a common source line 320. A plurality of word-lines 330, including word-lines 331 to 338, may be stacked on the second substrate 310 along a direction (Z-axis direction) perpendicular to a top face of the second substrate 310. String select lines and a ground select line may be disposed above and below the word-lines 330. Thus, the plurality of word-lines 330 may be disposed between the string select lines and the ground select line. Similarly, the second cell area CELL2 may include a third substrate 410 and a common source line 420. A plurality of word-lines 430, including word-lines 431 to 438, may be stacked on the third substrate 410 along the Z-axis direction perpendicular to a top face of the third substrate 410. Each of the second substrate 310 and the third substrate 410 may be made of each of a variety of materials. For example, each of the second substrate 310 and the third substrate 410 may be embodied as a silicon substrate, a silicon-germanium substrate, a germanium substrate, or a substrate having a monocrystalline silicon layer and a monocrystalline epitaxial layer grown on the monocrystalline silicon substrate. A plurality of channel structures CH may be formed in each of the first and second cell areas CELL1 and CELL2.

In one embodiment, as shown in A1, the channel structure CH may be disposed in the bit-line bonding area BLBA, and may extend in a direction perpendicular to the top face of the second substrate 310 and may extend through the word-lines 330, the string select lines, and the ground select line. The channel structure CH may include a data storage layer, a channel layer, and a buried insulating layer. The channel layer may be electrically connected to the first metal wiring 350*c* and the second metal wiring 360*c* in the bit-line bonding area BLBA. For example, the second metal wiring 360*c* may act as a bit-line, and may be connected to the channel structure CH via the first metal wiring 350*c*. The bit-line 360*c* may extend along a first direction (Y-axis direction) parallel to the top face of the second substrate 310.

In one embodiment, as shown in A2, the channel structure CH may include a lower channel LCH and an upper channel UCH connected to each other. For example, the channel structure CH may be formed using a process for forming the lower channel LCH and a process for forming the upper channel UCH. The lower channel LCH may extend in a direction perpendicular to the top face of the second substrate 310 and extend through the common source line 320 and the lower word-lines 331 and 332. The lower channel LCH may include a data storage layer, a channel layer, and a buried insulating layer, and may be connected to the upper channel UCH. The upper channel UCH may extend through the upper word-lines 333 to 338. The upper channel UCH may include a data storage layer, a channel layer, and a buried insulating layer, and the channel layer of the upper channel UCH may be electrically connected to the first metal wiring 350*c* and the second metal wiring 360*c*. As a length of the channel increases, it may be difficult to form a channel having a constant width due to a process nature. The nonvolatile memory device 500 according to an embodiment of the present disclosure may include the lower channel LCH and the upper channel UCH sequentially formed in the sequential processes and thus may have an entire channel having improved width uniformity.

As shown in A2, when the channel structure CH is formed to include the lower channel LCH and the upper channel UCH, the word-line located near a boundary between the lower channel LCH and the upper channel UCH may act as a dummy word-line. For example, the word-line 332 and the word-line 333 constituting the boundary between the lower channel LCH and the upper channel UCH may act as dummy word-lines. In this case, data may not be stored in memory cells connected to the dummy word-line. Alternatively, the number of pages corresponding to memory cells connected to the dummy word-line may be smaller than the number of pages corresponding to memory cells connected to a normal word-line. A voltage level applied to the dummy word-line may be different from a voltage level applied to the normal word-line. Accordingly, influence of the non-uniformity between the channel widths of the lower channel LCH and the upper channel UCH on the operation of the memory device may be reduced.

An example of A2 is illustrated in which the number of the lower word-lines 331 and 332 through which the lower channel LCH extends is smaller than the number of the upper word-lines 333 to 338 through which the upper channel UCH extends. However, this is merely an example, and the present disclosure is not limited thereto. In another example, the number of the lower word-lines through which the lower channel LCH extends may be equal to or greater than the number of the upper word-lines through which the upper channel UCH extends. Further, the structure and the connection relationship of the channel structure CH disposed in the first cell area CELL1 as described above may be equally applied to those of the channel structure CH disposed in the second cell area CELL2.

In the bit-line bonding area BLBA, a first through electrode THV1 may be disposed in the first cell area CELL1, and a second through electrode THV2 may be disposed in the second cell area CELL2. As shown in FIG. 17, the first through electrode THV1 may extend through the common source line 320 and the plurality of word-lines 330. However, this is an example, and the first through electrode THV1 may further extend through the second substrate 310. The first through electrode THV1 may include a conductive material. Alternatively, the first through electrode THV1 may include a conductive material and an insulating material surrounding the conductive material. The second through electrode THV2 and the first through electrode THV1 may have the same shape and the same structure.

In one embodiment, the first through electrode THV1 and the second through electrode THV2 may be electrically connected to each other via a first through metal pattern 372*d* and a second through metal pattern 472*d*. The first through metal pattern 372*d* may be formed at a bottom of the first upper chip including the first cell area CELL1, while the second through metal pattern 472*d* may be formed at a top of the second upper chip including the second cell area CELL2. A lower via 371*d* may be formed between the first through electrode THV1 and the first through metal pattern 372*d*, and an upper via 471*d* may be formed between the second through electrode THV2 and the second through metal pattern 472*d*. The first through electrode THV1 may be electrically connected to the lower via 371*d* through the first metal wiring 350*c* and the second metal wiring 360*c*, and the second through electrode THV2 may be electrically connected to the upper via 471*d* through the first metal wiring 450*c* and the second metal wiring 460*c*. The first through metal pattern 372*d* and the second through metal pattern 472*d* may be connected to each other in a bonding scheme.

Further, in the bit-line bonding area BLBA, an upper metal pattern 252 may be formed in the uppermost metal layer of the peripheral circuit area PERI, and an upper metal pattern 392 having the same shape as that of the upper metal pattern 252 may be formed in the uppermost metal layer of the first cell area CELL1. The upper metal pattern 392 of the first cell area CELL1 and the upper metal pattern 252 of the peripheral circuit area PERI may be electrically connected to each other in a bonding scheme. In the bit-line bonding area BLBA, the bit-line 360*c* may be electrically connected to a page buffer included in the peripheral circuit area PERI. For example, some of the circuit elements 220*c* of the peripheral circuit area PERI may act as the page buffer. The bit-line 360*c* may be electrically connected to the circuit elements 220*c* acting as the page buffer via the upper bonding metal 370*c* of the first cell area CELL1 and the upper bonding metal 270*c* of the peripheral circuit area PERI.

Continuously referring to FIG. 17, in the word-line bonding area WLBA, the word-lines 330 of the first cell area CELL1 may extend along a second direction (X-axis direction) parallel to the top face of the second substrate 310 and may be respectively connected to a plurality of cell contact plugs 340, including cell contact plugs 341 to 347. A first metal wiring 350*b* and a second metal wiring 360*b* may be sequentially connected to each of the cell contact plugs 340 respectively connected to the word-lines 330. The cell contact plugs 340 may be connected to the peripheral circuit area PERI via an upper bonding metal 370*b* of the first cell area CELL1 and an upper bonding metal 270*b* of the peripheral circuit area PERI in the word-line bonding area WLBA.

The cell contact plugs 340 may be electrically connected to a row decoder included in the peripheral circuit area PERI. For example, some of the circuit elements 220*b* of the peripheral circuit area PERI may act as the row decoder. The cell contact plugs 340 may be electrically connected to the circuit elements 220*b* acting as the row decoder via the upper bonding metal 370*b* of the first cell area CELL1 and the upper bonding metal 270*b* of the peripheral circuit area PERI. In one embodiment, an operating voltage of the circuit elements 220*b* acting as the row decoder may be different from the operating voltage of the circuit elements 220*c* acting as the page buffer. For example, the operating voltage of the circuit elements 220*c* acting as the page buffer may be greater than the operating voltage of the circuit elements 220*b* acting as the row decoder.

Similarly, in the word-line bonding area WLBA, the word-lines 430 of the second cell area CELL2 may extend along the second direction (X-axis direction) parallel to the top face of the third substrate 410, and may be connected to a plurality of cell contact plugs 440, including cell contact plugs 441 to 447. The cell contact plugs 440 may be connected to the peripheral circuit area PERI via an upper metal pattern of the second cell area CELL2, a lower metal pattern and an upper metal pattern of the first cell area CELL1, and a cell contact plug 348.

In the word-line bonding area WLBA, the upper bonding metal 370*b* may be formed in the first cell area CELL1, and the upper bonding metal 270*b* may be formed in the peripheral circuit area PERI. The upper bonding metal 370*b* of the first cell area CELL1 and the upper bonding metal 270*b* of the peripheral circuit area PERI may be electrically connected to each other in a bonding scheme. Each of the upper bonding metal 370*b* and the upper bonding metal 270*b* may be made of aluminum, copper, tungsten, or the like.

In the outer pad bonding area PA, a lower metal pattern 371*e* may be formed in a bottom of the first cell area CELL1, and an upper metal pattern 472*a* may be formed in a top of the second cell area CELL2. The lower metal pattern 371*e* of the first cell area CELL1 and the upper metal pattern 472*a* of the second cell area CELL2 may be connected to each other in a bonding scheme in the outer pad bonding area PA. Similarly, an upper metal pattern 372*a* may be formed in a top of the first cell area CELL1, and an upper metal pattern 272*a* may be formed in a top of the peripheral circuit area PERI. The upper metal pattern 372*a* of the first cell area CELL1 and the upper metal pattern 272*a* of the peripheral circuit area PERI may be connected to each other in a bonding scheme.

Common source line contact plugs 380 and 480 may be disposed in the outer pad bonding area PA. Each of the common source line contact plugs 380 and 480 may be made of a conductive material such as metal, a metal compound, or doped polysilicon. The common source line contact plug 380 of the first cell area CELL1 may be electrically connected to the common source line 320, while the common source line contact plug 480 of the second cell area CELL2 may be electrically connected to the common source line 420. A first metal wiring 350*a* and a second metal wiring 360*a* may be sequentially stacked on the common source line contact plug 380 of the first cell area CELL1, while a first metal wiring 450*a* and a second metal wiring 460*a* may be sequentially stacked on the common source line contact plug 480 of the second cell area CELL2.

Input/output pads 205, 405, and 406 may be disposed in the outer pad bonding area PA. Referring to FIG. 17, a lower insulating film 201 may cover a bottom face of the first substrate 210, and the first input/output pad 205 may be formed on the lower insulating film 201. The first input/output pad 205 may be connected to at least one of the plurality of circuit elements 220*a* disposed in the peripheral circuit area PERI via a first input/output contact plug 203, and may be spaced from the first substrate 210 via the lower insulating film 201. Further, although not illustrated, a side insulating film may be disposed between the first input/output contact plug 203 and the first substrate 210 so as to electrically insulate the first input/output contact plug 203 and the first substrate 210 from each other.

An upper insulating film 401 covering a top face of the third substrate 410 may be formed on a top face of the third substrate 410. The second input/output pad 405 and/or the third input/output pad 406 may be disposed on the upper insulating film 401. The second input/output pad 405 may be connected to at least one of the plurality of circuit elements 220*a* disposed in the peripheral circuit area PERI via second input/output contact plugs 403 and 303. The third input/output pad 406 may be connected to at least one of the plurality of circuit elements 220*a* disposed in the peripheral circuit area PERI via third input/output contact plugs 404 and 304.

In one embodiment, the third substrate 410 may not be disposed in an area where the input/output contact plug is disposed. For example, as shown in B, the third input/output contact plug 404 may be spaced from the third substrate 410 in a direction parallel to the top face of the third substrate 410 and may extend through the interlayer insulating layer 415 of the second cell area CELL2 and may be connected to the third input/output pad 406. In this case, the third input/output contact plug 404 may be formed by various processes.

In one example, as shown in B1, the third input/output contact plug 404 may extend in the third direction (Z-axis direction), and may increase in a diameter thereof as the third input/output contact plug 404 extends toward the upper insulating film 401. For example, a diameter of the channel structure CH as described in A1 may become smaller as the channel structure CH extends toward the upper insulating film 401, whereas the diameter of the third input/output contact plug 404 may become larger as the third input/output contact plug 404 extends toward the upper insulating film 401. For example, the third input/output contact plug 404 may be formed after the second cell area CELL2 and the first cell area CELL1 are connected to each other in a bonding scheme.

Further, in one example, as shown in B2, the third input/output contact plug 404 may extend in the third direction (Z-axis direction), and may decrease in a diameter thereof as the third input/output contact plug 404 extends toward the upper insulating film 401. For example, the diameter of the third input/output contact plug 404 may be formed to become smaller as the third input/output contact plug 404 extends toward the upper insulating film 401. For example, the third input/output contact plug 404 may be formed together with the cell contact plugs 440 before the second cell area CELL2 and the first cell area CELL1 are bonded to each other.

In another embodiment, the input/output contact plug may be disposed to overlap the third substrate 410. For example, as shown in C, the second input/output contact plug 403 may extend through the interlayer insulating layer 415 of the second cell area CELL2 in the third direction (Z-axis direction), and may extend through the third substrate 410 and may be electrically connected to the second input/output pad 405. In this case, a connection structure between the second input/output contact plug 403 and the second input/output pad 405 may be implemented in various schemes.

In one example, as shown in C1, an opening 408 extending through the third substrate 410 may be formed, and the second input/output contact plug 403 may be directly connected to the second input/output pad 405 via the opening 408 formed in the third substrate 410. In this case, as shown in C1, a diameter of the second input/output contact plug 403 may increase as the second input/output contact plug 403 extends toward the second input/output pad 405. However, this is an example, and the diameter of the second input/output contact plug 403 may decrease at the plug extends toward the second input/output pad 405.

In another example, as shown in C2, the opening 408 extending through the third substrate 410 may be formed, and a contact 407 may be formed in the opening 408. One end of the contact 407 may be connected to the second input/output pad 405, and the other end of the contact 407 may be connected to the second input/output contact plug 403. Accordingly, the second input/output contact plug 403 may be electrically connected to the second input/output pad 405 via the contact 407 formed in the opening 408. In this case, as shown in C2, a diameter of the contact 407 may increase as the contact extends toward the second input/output pad 405, and a diameter of the second input/output contact plug 403 may decrease as the plug extends toward the second input/output pad 405. For example, the third input/output contact plug 403 may be formed together with the cell contact plugs 440 before the second cell area CELL2 and the first cell area CELL1 are bonded to each other. The contact 407 may be formed after the second cell area CELL2 and the first cell area CELL1 are bonded to each other.

In still another example, as shown in C3, a stopper 409 may be further formed on a top face of the opening 408 of the third substrate 410, compared to C2. The stopper 409 may be a metal wiring formed in the same layer as a layer of the common source line 420. However, this is only an example, and the stopper 409 may be a metal wiring formed in the same layer as that pf at least one of the word-lines 430. The second input/output contact plug 403 may be electrically connected to the second input/output pad 405 via the contact 407 and the stopper 409.

In one example, in a similar manner to the second and third input/output contact plugs 403 and 404 of the second cell area CELL2, a diameter of each of the second and third input/output contact plugs 303 and 304 of the first cell area CELL1 may decrease or increase as each of the second and third input/output contact plugs 303 and 304 extends toward the metal pattern 371*e*.

In still another example as in D1, D2, and D3, a slit 411 may be formed in the third substrate 410. For example, the slit 411 may be formed at any position in the outer pad bonding area PA. In one example, the slit 411 may be positioned between the second input/output pad 405 and the cell contact plugs 440 in a plan view. However, this is an example.

In a plan view, the slit 411 may be formed such that the second input/output pad 405 is positioned between the slit 411 and the cell contact plugs 440.

In one example, as shown in D1, the slit 411 may be formed to extend through the third substrate 410. The slit 411 may be used, for example, to prevent the third substrate 410 from finely cracking when the opening 408 is formed. However, this is an example, and the slit 411 may be formed to have a depth of about 60 to 70% of a thickness of the third substrate 410.

Further, in another example, as shown in D2, a conductive material 412 may be formed in the slit 411. The conductive material 412 may be used, for example, to discharge a leakage current generated during operation of the circuit elements in the outer pad bonding area PA to an outside. In this case, the conductive material 412 may be connected to an external ground line.

Further, in still another example, as shown in D3, an insulating material 413 may be formed in the slit 411. The insulating material 413 may be formed, for example, to electrically insulate the second input/output pad 405 and the second input/output contact plug 403 disposed in the outer pad bonding area PA from the word-line bonding area WLBA. The forming of the insulating material 413 in the slit 411 may prevent a voltage applied via the second input/output pad 405 from affecting the metal layer disposed on the third substrate 410 in the word-line bonding area WLBA.

In one example, according to embodiments, the first to the third input/output pads 205, 405, and 406 may be selectively formed. For example, the nonvolatile memory device 500 may be implemented to include only the first input/output pad 205 disposed on a top of the first insulating film 201, or to include only the second input/output pad 405 disposed on a top of the third substrate 410. Alternatively, the nonvolatile memory device 500 may be implemented to include only the third input/output pad 406 disposed on a top of the upper insulating film 401.

In one example, according to embodiments, at least one of the second substrate 310 of the first cell area CELL1 and the third substrate 410 of the second cell area CELL2 may act as a sacrificial substrate, and may be entirely or partially removed after or before the bonding process. After the substrate has been removed, an additional layer may be deposited. For example, the second substrate 310 of the first cell area CELL1 may be removed before or after a bonding process between the peripheral circuit area PERI and the first cell area CELL1, and then, an insulating film covering a top face of the common source line 320 or a conductive film for connection may be formed. Similarly, the third substrate 410 of the second cell area CELL2 may be removed before or after a bonding process between the first cell area CELL1 and the second cell area CELL2, and then, the upper insulating film 401 covering the top face of the common source line 420 or a conductive film for connection may be formed.

In the nonvolatile memory device of FIG. 17 according to some embodiments, the metal silicide trapped in the semiconductor pattern 130 may be removed or reduced using the manufacturing method as described above through FIG. 1 to FIG. 14, such that the metal silicide T_M(b) may exist only in the grain boundary of the semiconductor pattern as in the enlarged views of A1 and A2.

Figure 18:
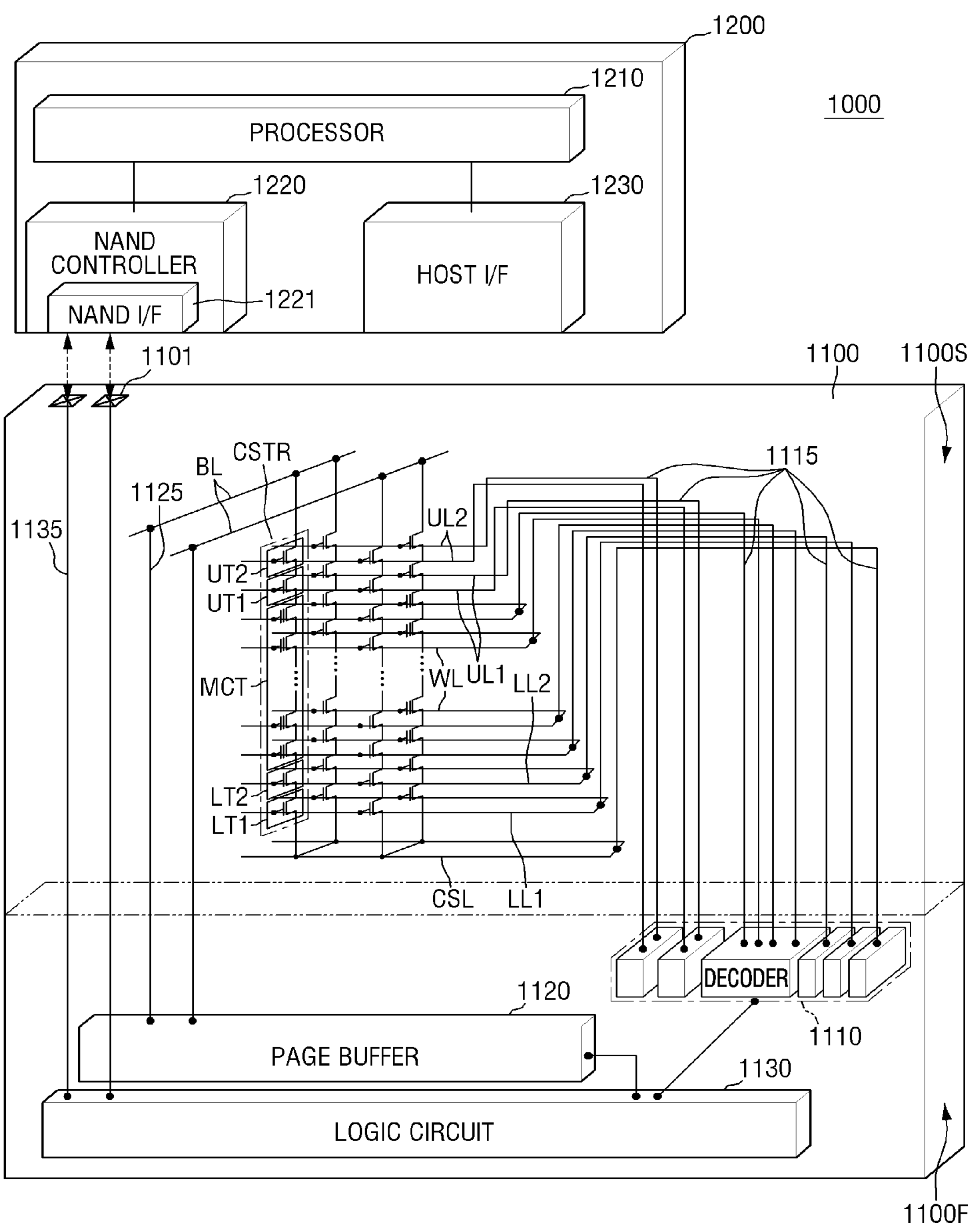
FIG. 18 and FIG. 19 are illustrative block diagrams for illustrating a memory system including a nonvolatile memory device according to some example embodiments.
Figure 19:
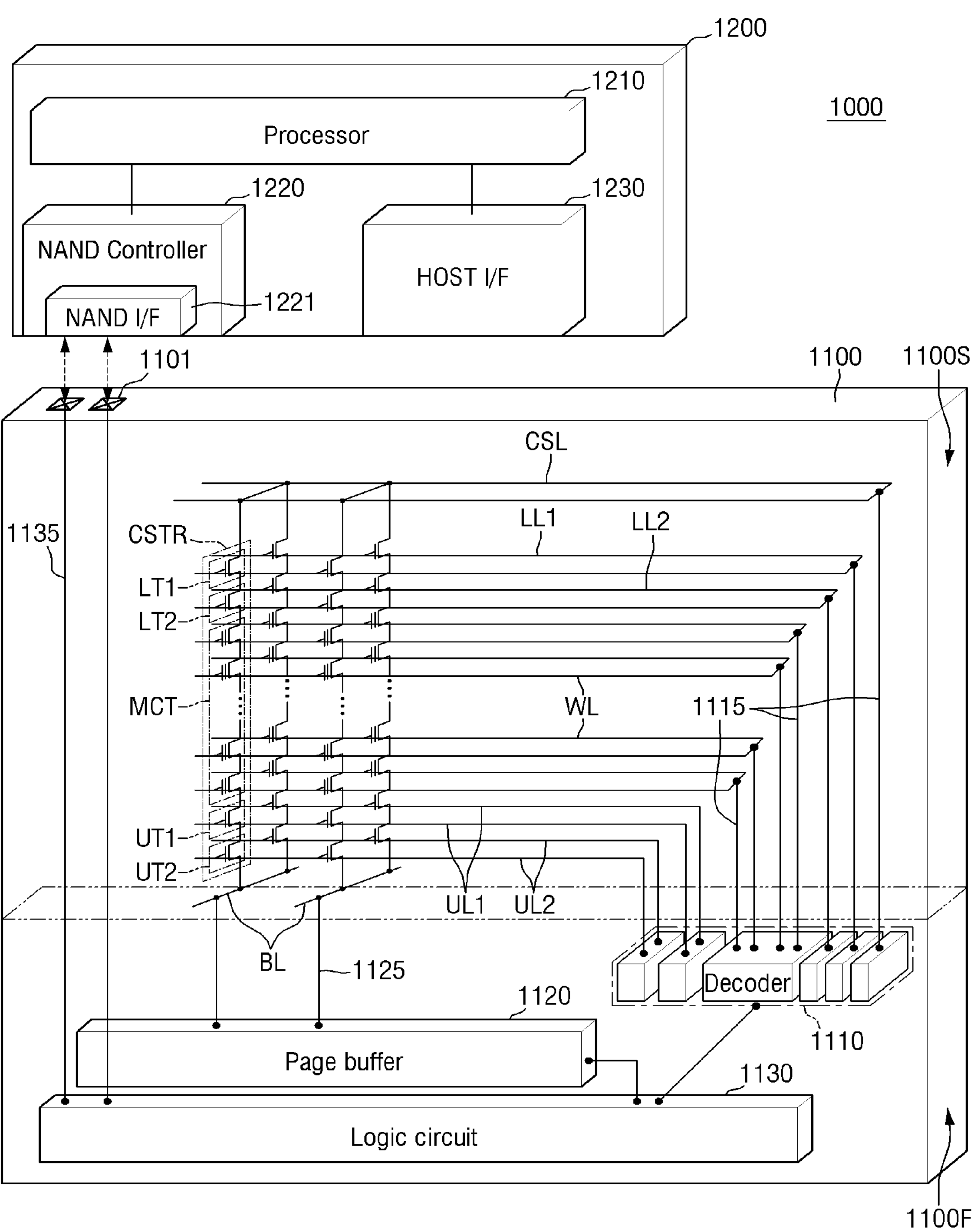

FIG. 18 and FIG. 19 are illustrative block diagrams for illustrating a memory system including a nonvolatile memory device according to some example embodiments.

FIG. 18 and FIG. 19 are diagrams schematically showing an electronic system including a semiconductor device according to an illustrative embodiment of the present disclosure.

Referring to FIG. 18 and FIG. 19, a memory system 1000 according to an illustrative embodiment of the present disclosure may include a semiconductor memory device 1100 and a controller 1200 electrically connected to the semiconductor memory device 1100. The memory system 1000 may act as a storage device including one or a plurality of semiconductor memory devices 1100 or an electronic device including the storage device. For example, the memory system 1000 may act as an SSD device (a solid-state drive device) a USB (Universal Serial Bus), a computing system, a medical device, or a communication device including one or a plurality of semiconductor memory devices 1100.

The semiconductor memory device 1100 may be embodied as a nonvolatile memory device, for example, the nonvolatile memory device as described above with reference to FIG. 1 to FIG. 17. The semiconductor memory device 1100 may include a first structure 1100F and a second structure 1100S on the first structure 1100F. In some embodiments, the first structure 1100F may be disposed next to the second structure 1100S. The first structure 1100F may be embodied as a peripheral circuit structure including a decoder circuit 1110, a page buffer 1120, and a logic circuit 1130. The second structure 1100S may be embodied as a memory cell structure including bit-lines BL, a common source line CSL, word-lines WL, first and second gate upper lines UL1 and UL2, first and second gate lower lines LL1 and LL2, and memory cell strings CSTR disposed between the bit-line BL and the common source line CSL.

In the second structure 1100S, each of the memory cell strings CSTR may include lower transistors LT1 and LT2 adjacent to the common source line CSL, upper transistors UT1 and UT2 adjacent to the bit-line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously modified according to embodiments.

In some embodiments, each of the upper transistors UT1 and UT2 may include a string select transistor, and each of the lower transistors LT1 and LT2 may include a ground select transistor. The gate lower lines LL1 and LL2 may act as gate electrodes of the lower transistors LT1 and LT2, respectively. The word-lines WL may act as gate electrodes of the memory cell transistors MCT, respectively. The gate upper lines UL1 and UL2 may act as gate electrodes of the upper transistors UT1 and UT2, respectively.

In some embodiments, the lower transistors LT1 and LT2 may include a lower erase control transistor LT1 and a ground select transistor LT2 connected to each other in a series manner. The upper transistors UT1 and UT2 may include a string select transistor UT1 and an upper erase control transistor UT2 connected to each other in a series manner. At least one of the lower erase control transistor LT1 and the upper erase control transistor UT1 may be used for an erase operation of erasing data stored in the memory cell transistors MCT using gate induced leakage current (GIDL) phenomenon.

The common source line CSL, the first and second gate lower lines LL1 and LL2, the word-lines WL, and the first and second gate upper lines UL1 and UL2 may be electrically connected to the decoder circuit 1110 via gate connection wirings 1115 extending from a position in the first structure 1100F to the second structure 1100S. The bit-lines BL may be electrically connected to the page buffer 1120 via second connection wirings 1125 extending from a position in the first structure 1100F to the second structure 1100S.

In the first structure 1100F, the decoder circuit 1110 and the page buffer 1120 may execute a control operation of at least one memory cell transistor selected among from the plurality of memory cell transistors MCT. The decoder circuit 1110 and the page buffer 1120 may be controlled by the logic circuit 1130. The semiconductor memory device 1100 may communicate with the controller 1200 via an input/output pad 1101 that is electrically connected to the logic circuit 1130. The input/output pad 1101 may be electrically connected to the logic circuit 1130 via an input/output connection wiring 1135 extending from a position in the first structure 1100F to the second structure 1100S.

The controller 1200 may include a processor 1210, a NAND controller 1220, and a host interface 1230. In some embodiments, the memory system 1000 may include a plurality of semiconductor memory devices 1100. In this case, the controller 1200 may control the plurality of semiconductor memory devices 1100.

The processor 1210 may control overall operations of the memory system 1000 including the controller 1200. The processor 1210 may operate under a control of predefined firmware, and may control the NAND controller 1220 to access the semiconductor memory device 1100. The NAND controller 1220 may include a NAND interface (I/F) 1221 that processes the communication with the semiconductor memory device 1100. Via the NAND interface 1221, a control command for controlling the semiconductor memory device 1100, data to be written to the memory cell transistors MCT of the semiconductor memory device 1100, and data to be read from the memory cell transistors MCT of the semiconductor memory device 1100 may be transmitted. The host interface 1230 may provide a communication function between the memory system 1000 and an external host. Upon receiving a control command from the external host via the host interface 1230, the processor 1210 may control the semiconductor memory device 1100 in response to the control command.

Figure 20:
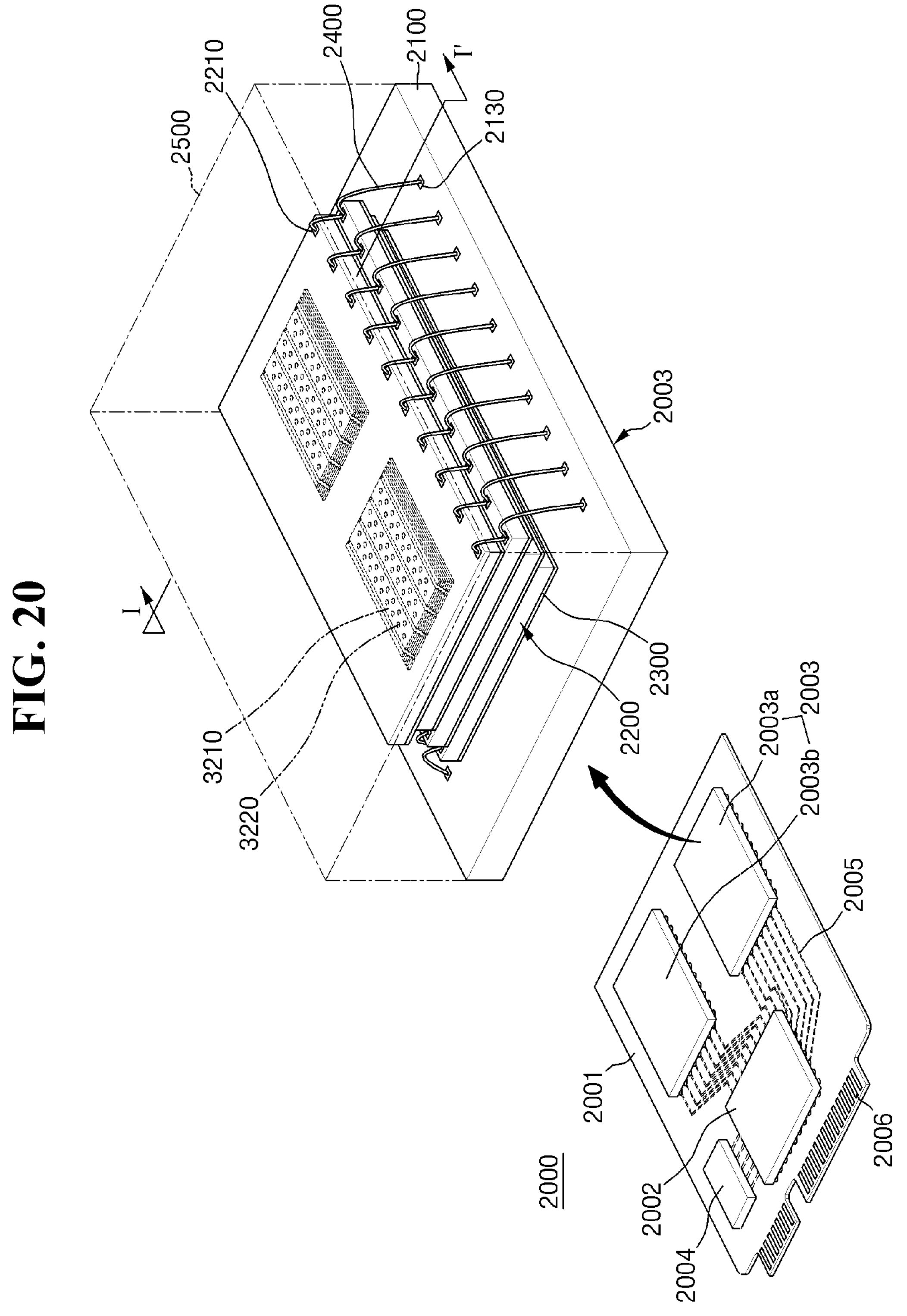
FIG. 20 is an illustrative perspective view for illustrating a memory system including a nonvolatile memory device according to some example embodiments.

FIG. 20 is an illustrative perspective view for illustrating a memory system including a nonvolatile memory device according to some example embodiments.

Referring to FIG. 20, an electronic system 2000 according to an illustrative embodiment of the present disclosure may include a main substrate 2001, and a controller 2002, at least one semiconductor package 2003 and at least one DRAM 2004 mounted on the main substrate 2001. The semiconductor package 2003 and the DRAM 2004 may be connected to the controller 2002 via wiring patterns 2005 formed on the main substrate 2001.

The main substrate 2001 may include a connector 2006 including a plurality of pins coupled to an external host. The number and an arrangement of the plurality of pins in the connector 2006 may vary based on a communication interface between the electronic system 2000 and the external host. In some embodiments, the electronic system 2000 may communicate with the external host using one of interfaces such as USB (Universal Serial Bus), PCI-Express (Peripheral Component Interconnect Express), SATA (Serial Advanced Technology Attachment), M-Phy for UFS (Universal Flash Storage), etc. In some embodiments, the electronic system 2000 may operate using power supplied from the external host via the connector 2006. The electronic system 2000 may further include a power management integrated circuit (PMIC) for distributing power supplied from the external host to the controller 2002 and the semiconductor package 2003.

The controller 2002 may write data to the semiconductor package 2003 or read data from the semiconductor package 2003, and may improve an operating speed of the electronic system 2000.

The DRAM 2004 may act as a buffer memory for reducing a difference between operation speeds of the semiconductor package 2003 as a data storage space and the external host. The DRAM 2004 included in electronic system 2000 may operate as a cache memory, and may provide a space for temporarily storing data therein in a control operation of the semiconductor package 2003. When the DRAM 2004 is included in the electronic system 2000, the controller 2002 may further include a DRAM controller for controlling the DRAM 2004 in addition to a NAND controller for controlling the semiconductor package 2003.

The semiconductor package 2003 may include a first semiconductor package 2003*a* and a second semiconductor package 2003*b* spaced apart from each other. Each of the first semiconductor package 2003*a* and the second semiconductor package 2003*b* may be embodied as a semiconductor package including a plurality of semiconductor chips 2200. Each of the first semiconductor package 2003*a* and the second semiconductor package 2003*b* may include a package substrate 2100, semiconductor chips 2200 on the package substrate 2100, adhesive layers 2300 disposed on a bottom face of each of the semiconductor chips 2200, a connection structure 2400 electrically connecting the semiconductor chips 2200 and the package substrate 2100 to each other, and a molding layer 2500 disposed on the package substrate 2100 and covering the semiconductor chips 2200 and the connection structure 2400.

The package substrate 2100 may be embodied as a printed circuit board including package upper pads 2130. Each semiconductor chip 2200 may include an input/output pad 2210. The input/output pad 2210 may correspond to the input/output pad 1101 of FIG. 18 and FIG. 19. Each of the semiconductor chips 2200 may include a plurality of gate electrodes 3210 and a plurality of channel structures 3220. Each of the semiconductor chips 2200 may include the nonvolatile memory device as described above with reference to FIG. 1 to FIG. 17.

In some embodiments, the connection structure 2400 may be embodied as a bonding wire that electrically connects the input/output pad 2210 and the package upper pads 2130 to each other. Accordingly, in each of the first semiconductor package 2003*a* and the second semiconductor package 2003*b*, the semiconductor chips 2200 may be electrically connected to each other in a bonding wire scheme, and may be electrically connected to the package upper pads 2130 of the package substrate 2100. In some embodiments, in each of the first semiconductor package 2003*a* and the second semiconductor package 2003*b*, the semiconductor chips 2200 may be electrically connected to each other via a connection structure including a through electrode (Through Silicon Via: TSV) instead of the connection structure 2400 using the bonding wire scheme.

In some embodiments, the controller 2002 and the semiconductor chips 2200 may be included in one package. In some embodiments, the controller 2002 and the semiconductor chips 2200 may be mounted on a separate interposer substrate different from the main substrate 2001, and the controller 2002 and the semiconductor chips 2200 may be connected to each other via a line formed in the interposer substrate.

Figure 21:
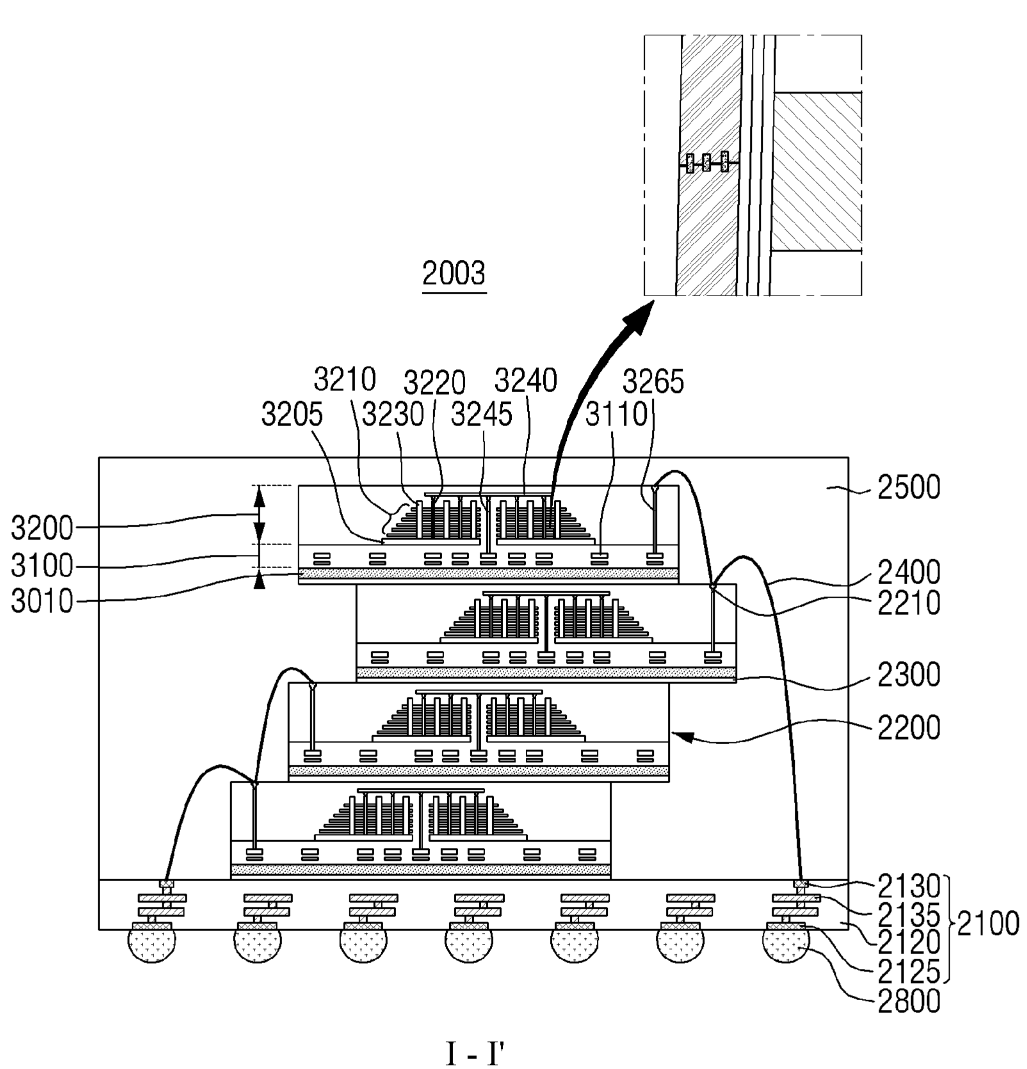
FIG. 21 to FIG. 23 are illustrative cross-sectional views to illustrate a cross-sectional view of the semiconductor package of FIG. 20 as taken along a cutting line I-I'.
Figure 22:
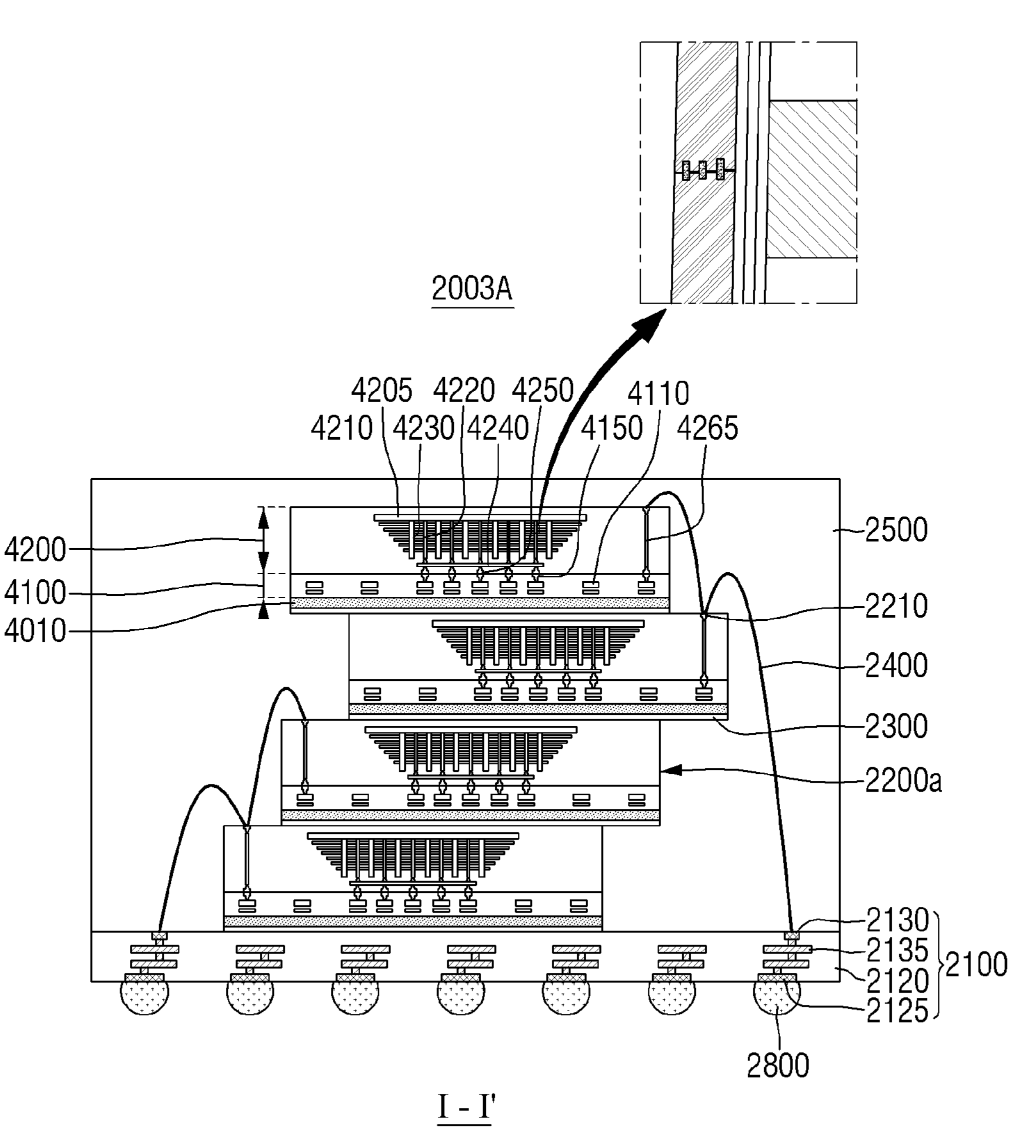
Figure 23:
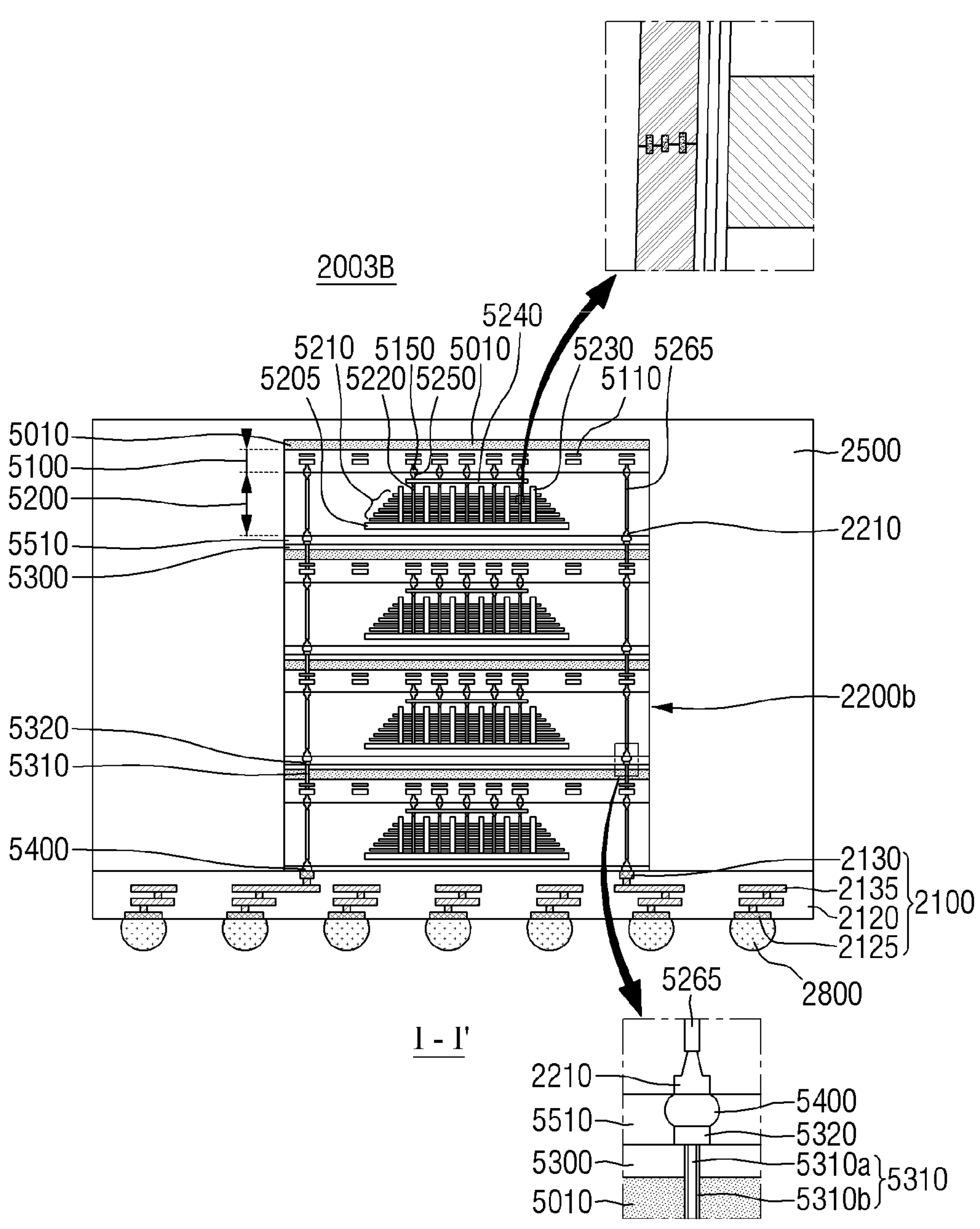

FIG. 21 to FIG. 23 are illustrative cross-sectional views to illustrate a cross-sectional view of the semiconductor package 2003 of FIG. 20 as taken along a cutting line I-I'.

FIG. 21 and FIG. 22 are cross-sectional views schematically showing semiconductor packages according to an illustrative embodiment of the present disclosure. Each of FIG. 21 and FIG. 22 illustrates an illustrative embodiment of the semiconductor package 2003 of FIG. 20, and conceptually represents a cross-section cut along the cutting line I-I' of the semiconductor package 2003 of FIG. 20.

Referring to FIG. 21, in the semiconductor package 2003, the package substrate 2100 may be embodied as a printed circuit substrate. The package substrate 2100 may include a package substrate body 2120, package upper pads 2130 disposed on a top face of the package substrate body 2120, lower pads 2125 disposed on a bottom face of the package substrate body 2120 or exposed through the bottom face thereof, and internal wirings 2135 that are disposed in the package substrate body 2120 and electrically connect the upper pads 2130 and the lower pads 2125 to each other. The upper pads 2130 may be electrically connected to the connection structures 2400. The lower pads 2125 may be connected to the wiring patterns 2005 of the main substrate 2010 of the memory system 2000 as shown in FIG. 18 and FIG. 19 via conductive connective portions 2800.

Each of the semiconductor chips 2200 may include a semiconductor substrate 3010 and a first structure 3100 and a second structure 3200 that are sequentially stacked on the semiconductor substrate 3010. The first structure 3100 may include a peripheral circuit area including peripheral wirings 3110. The second structure 3200 includes a common source line 3205, a plurality of gate electrodes 3210 disposed on the common source line 3205, channel structures 3220 and isolation structures 3230 extending through the plurality of gate electrodes 3210, bit-lines 3240 electrically connected to the channel structures 3220, and the gate connection wirings (e.g., gate connection wirings 1115 of FIG. 18 and FIG. 19) electrically connected to the word-lines (e.g., word-lines WL of FIG. 18 and FIG. 19) of the plurality of gate electrodes 3210.

In each of the channel structures 3220 of the second structure 3200, the metal silicide trapped in the semiconductor pattern may be removed using the manufacturing method as described above with reference to FIGS. 1 to 14, so that the metal silicide T_M(b) may be present only in the grain boundary of the semiconductor pattern as shown in an enlarged view.

Each of the semiconductor chips 2200 may include a through wiring 3245 electrically connected to the peripheral wirings 3110 of the first structure 3100 and extending into the second structure 3200. The through wiring 3245 may extend through the plurality of gate electrodes 3210 and may be further disposed outside the plurality of gate electrodes 3210. Each of the semiconductor chips 2200 may further include an input/output connection wiring 3265 electrically connected to the peripheral wirings 3110 of the first structure 3100 and extending into the second structure 3200 and the input/output pad 2210 electrically connected to the input/output connection wiring 3265.

Referring to FIG. 22, in a semiconductor package 2003A, each of semiconductor chips 2200*a* may include a semiconductor substrate 4010, a first structure 4100 disposed on the semiconductor substrate 4010, and a second structure 4200 disposed on the first structure 4100 and bonded to the first structure 4100 in a wafer bonding scheme.

The first structure 4100 may include a peripheral circuit area including a peripheral wiring 4110 and first bonding structures 4150. The second structure 4200 may include a common source line 4205, a plurality of gate electrodes 4210 between the common source line 4205 and the first structure 4100, channel structures 4220 and an isolation structure 4230 extending through the plurality of gate electrodes 4210, and second bonding structures 4250 electrically connected to the channel structures 4220 and the word-lines of the plurality of gate electrodes 4210, respectively. For example, the second bonding structures 4250 may be respectively electrically connected to the channel structures 4220 and the word-lines via bit-lines 4240 electrically connected to the channel structures 4220, and the gate connection wirings (e.g., gate connection wirings 1115 in FIG. 18 and FIG. 19) electrically connected to the word-lines (e.g., word-lines WL of FIG. 18 and FIG. 19). The first bonding structures 4150 of the first structure 4100 and the second bonding structures 4250 of the second structure 4200 may be bonded to each other while contacting each other. Each of contact portions of the first bonding structures 4150 and the second bonding structures 4250 may be made of, for example, copper (Cu).

In each of the channel structures 4220 of the second structure 4200, the metal silicide trapped in the semiconductor pattern may be removed using the manufacturing method as described above with reference to FIGS. 1 to 14, so that the metal silicide T_M(b) may be present only in the grain boundary of the semiconductor pattern as shown in an enlarged view.

Each of the semiconductor chips 2200*a* may further include the input/output pad 2210 and an input/output connection wiring 4265 disposed under the input/output pad 2210. The input/output connection wiring 4265 may be electrically connected to some of the second bonding structures 4250.

The semiconductor chips 2200 of FIG. 21 may be electrically connected to each other via the connection structures 2400 in a form of bonding wires. The semiconductor chips 2200*a* of FIG. 22 may be electrically connected to each other via the connection structures 2400 in a form of bonding wires. However, in some embodiments, the semiconductor chips in one semiconductor package such as the semiconductor chips 2200 of FIG. 21 or the semiconductor chips 2200*a* of FIG. 22 may be electrically connected to each other via a connection structure including a through electrode TSV.

FIG. 23 illustrates an illustrative embodiment of the semiconductor package 2003 of FIG. 20, and conceptually shows a cross-section cut along the cutting line I-I' of semiconductor package 2003 of FIG. 20.

Referring to FIG. 23, in a semiconductor device 2003B, semiconductor chips 2200*b* may be vertically aligned with each other. Each of the semiconductor chips 2200*b* may include a semiconductor substrate 5010, a first structure 5100 formed under the semiconductor substrate 5010, and a second structure 5200 formed under the first structure 5100, wherein the second structure 5200 is bonded to the first structure 5100 in a wafer bonding scheme.

The first structure 5100 may include a peripheral circuit area including a peripheral wiring 5110 and first bonding structures 5150. The second structure 5200 may include a common source line 5205, a gate stack structure 5210 disposed between the common source line 5205 and the first structure 5100, memory channel structures 5220 and isolation structures 5230 extending through the gate stack structure 5210, and second bonding structures 5250 electrically connected to the memory channel structures 5220 and the word-lines of the gate stack structure 5210, respectively. For example, the second bonding structures 5250 may be electrically connected to the memory channel structures 5220 and the word-lines, respectively, via bit-lines 5240 electrically connected to the memory channel structures 5220 and the gate connection wirings (e.g., gate connection wirings 1115 in FIG. 18 and FIG. 19) electrically connected to the word-lines (e.g., word-lines WL in FIG. 1). The first bonding structures 5150 of the first structure 5100 and the second bonding structures 5250 of the second structure 5200 may be bonded to each other while contacting each other. Each of contact portions of the first bonding structures 5150 and the second bonding structures 5250 may be made of, for example, copper (Cu).

Each of remaining semiconductor chips except the uppermost semiconductor chip among the semiconductor chips 2200*b* may further include a rear insulating layer 5300 on the semiconductor substrate 5010, rear input/output pads 5320 on the rear insulating layer 5300, and through electrode structures 5310 extending through the semiconductor substrate 5010 and the rear insulating layer 5300 and electrically connecting the peripheral wirings 5110 of the first structure 5100 and the rear input/output pads 5320 to each other. Each of the through electrode structures 5310 may include a through electrode 5310*a* and an insulating spacer 5310*b* surrounding a side face of the through electrode 5310*a*. The semiconductor device 2003B may further include connection structures 5400 disposed under each of the semiconductor chips 2200*b*. For example, each of the connection structures 5400 may be embodied as a conductive bump. The connection structures 5400 may electrically connect the semiconductor chips 2200*b* to each other and electrically connect the semiconductor chips 2200*b* and the package substrate 2100 to each other. An underfill material layer 5510 may surround a side face of the conductive structure 5400.

In each of the memory channel structures 5220 of the second structure 5200, the metal silicide trapped in the semiconductor pattern may be removed using the manufacturing method as described above with reference to FIGS. 1 to 14, so that the metal silicide T_M(b) may be present only in the grain boundary of the semiconductor pattern as shown in an enlarged view.

Although embodiments of the present disclosure have been described above with reference to the accompanying drawings, it will be understood by those of ordinary skill in the art that the present disclosure is not limited thereto and may be implemented in many different forms without departing from the technical idea or essential features thereof. Therefore, it should be understood that the embodiments set forth herein are merely examples in all respects and not restrictive.

What is claimed is:

1. A nonvolatile memory device comprising:

a plurality of gate electrodes and a plurality of insulating patterns alternately stacked in a first direction;

an information storage film formed along a sidewall of a trench, wherein the trench extends through the plurality of gate electrodes and the insulating patterns in the first direction;

a semiconductor pattern formed on the information storage film;

a spacer layer in contact with an inner sidewall of the semiconductor pattern; and a filling pattern in contact with the spacer layer and filling an inner space of spacer layer, wherein the semiconductor pattern is made of polycrystalline silicon composed of a first monocrystalline silicon and a second monocrystalline silicon, wherein a metal silicide is present in a grain boundary between the first monocrystalline silicon and the second monocrystalline silicon, and wherein the metal silicide is absent in each of the first monocrystalline silicon and the second monocrystalline silicon except for the grain boundary therebetween.

2. The nonvolatile memory device of claim 1, wherein an angle between crystal planes in a <111> direction of the first monocrystalline silicon and the second monocrystalline silicon is 109.5° or 70.5°.

3. The nonvolatile memory device of claim 1, wherein an initial metal silicide contained in the first monocrystalline silicon is removed therefrom by a process including:

forming a gettering layer on the semiconductor pattern; and performing thermal treatment on the gettering layer such that the initial metal silicide migrates from the first monocrystalline silicon to the gettering layer and thus is absent in the first monocrystalline silicon; and removing the gettering layer such that the metal silicide is present in the grain boundary.

4. The nonvolatile memory device of claim 3, wherein the thermal treatment is performed at a temperature in a range of 600° C. to 800° C.

5. The nonvolatile memory device of claim 3, wherein the gettering layer includes amorphous silicon doped with an impurity.

6. The nonvolatile memory device of claim 5, wherein the impurity includes phosphorus, arsenic, or boron.

7. The nonvolatile memory device of claim 1, wherein the first monocrystalline silicon contains phosphorus, arsenic, or boron.

8. A memory system comprising:

a nonvolatile memory device including an input/output pad electrically connected to a peripheral circuit; and a NAND controller electrically connected to the nonvolatile memory device via the input/output pad and controlling the nonvolatile memory device, wherein the nonvolatile memory device includes:

a plurality of gate electrodes and a plurality of insulating patterns alternately stacked in a first direction;

an information storage film formed along a sidewall of a trench, wherein the trench extends through the plurality of gate electrodes and the insulating patterns in the first direction;

a semiconductor pattern formed on the information storage film;

a spacer layer in contact with an inner sidewall of the semiconductor pattern; and a filling pattern in contact with the spacer layer and filling an inner space of spacer layer, wherein the semiconductor pattern is made of polycrystalline silicon composed of a first monocrystalline silicon and a second monocrystalline silicon, wherein a metal silicide is present in a grain boundary between the first monocrystalline silicon and the second monocrystalline silicon, and wherein the metal silicide is absent in each of the first monocrystalline silicon and the second monocrystalline silicon except for the grain boundary therebetween.

9. The memory system of claim 8, wherein an angle between crystal planes in a <111> direction of the first monocrystalline silicon and the second monocrystalline silicon is 109.5° or 70.5°.

10. The memory system of claim 8, wherein an initial metal silicide contained in the first monocrystalline silicon is removed therefrom by a process including:

forming a gettering layer on the semiconductor pattern;

performing thermal treatment on the gettering layer such that the initial metal silicide migrates from the first monocrystalline silicon to the gettering layer and thus is absent in the first monocrystalline silicon; and removing the gettering layer such that the metal silicide is present in the grain boundary.

11. The memory system of claim 10, wherein the thermal treatment is performed at a temperature in a range of 600° C. to 800° C.

12. The memory system of claim 10, wherein the gettering layer includes impurity-doped amorphous silicon.

13. A nonvolatile memory device comprising:

a plurality of gate electrodes and a plurality of insulating patterns alternately stacked on a substrate in a first direction;

an information storage film formed along a sidewall of a trench, wherein the trench extends through the plurality of gate electrodes and the insulating patterns in the first direction; and a semiconductor pattern formed on the information storage film, wherein the semiconductor pattern is made of polycrystalline silicon composed of a first monocrystalline silicon and a second monocrystalline silicon, wherein a metal silicide is present in a grain boundary between the first monocrystalline silicon and the second monocrystalline silicon, wherein the metal silicide is absent in each of the first monocrystalline silicon and the second monocrystalline silicon except for the grain boundary therebetween, and wherein the first monocrystalline silicon and the second monocrystalline silicon have different crystal planes.

14. The nonvolatile memory device of claim 13, wherein an angle between the crystal planes in a <111> direction of the first monocrystalline silicon and the second monocrystalline silicon is 109.5°.

15. The nonvolatile memory device of claim 13, wherein an angle between the crystal planes in a <111> direction of the first monocrystalline silicon and the second monocrystalline silicon is 70.5°.

16. The nonvolatile memory device of claim 13, wherein the semiconductor pattern contacts an upper surface of the substrate.

17. The nonvolatile memory device of claim 13, wherein an initial metal silicide contained in the first monocrystalline silicon is removed therefrom by a process including:

forming a gettering layer on the semiconductor pattern; and performing thermal treatment on the gettering layer such that the initial metal silicide migrates from the first monocrystalline silicon to the gettering layer and is absent in the first monocrystalline silicon; and removing the gettering layer such that the metal silicide is present in the grain boundary.

18. The nonvolatile memory device of claim 17, wherein the thermal treatment is performed at a temperature in a range of 600° C. to 800° C.

19. The nonvolatile memory device of claim 17, wherein the gettering layer includes amorphous silicon doped with an impurity.

20. The nonvolatile memory device of claim 19, wherein the impurity includes phosphorus, arsenic, or boron.

* * * * *